(12) United States Patent
Terasaki et al.

(10) Patent No.: US 7,795,157 B2
(45) Date of Patent: Sep. 14, 2010

(54) SUBSTRATE TREATMENT DEVICE AND MANUFACTURING METHOD OF SEMICONDUCTOR DEVICE

(75) Inventors: Masato Terasaki, Toyama (JP); Shinya Morita, Toyama (JP); Manabu Izumi, Toyama (JP)

(73) Assignee: Hitachi Kokusai Electric, Inc., Tokyo (JP)

(*) Notice: Subject to any disclaimer, the term of this patent is extended or adjusted under 35 U.S.C. 154(b) by 3 days.

(21) Appl. No.: 12/225,432

(22) PCT Filed: Aug. 3, 2007

(86) PCT No.: PCT/JP2007/065280

§ 371 (c)(1),
(2), (4) Date: Oct. 20, 2008

(87) PCT Pub. No.: WO2008/016143

PCT Pub. Date: Feb. 7, 2008

(65) Prior Publication Data

US 2009/0170338 A1 Jul. 2, 2009

(30) Foreign Application Priority Data

Aug. 4, 2006 (JP) .............................. 2006-212769
Nov. 17, 2006 (JP) .............................. 2006-311784

(51) Int. Cl.
*H01L 21/31* (2006.01)

(52) U.S. Cl. ................... 438/758; 118/61; 257/E33.06; 432/61; 432/66; 432/150

(58) Field of Classification Search .................. 422/202; 432/209, 61, 66, 150; 438/758; 257/E33.06; 118/61

See application file for complete search history.

(56) References Cited

U.S. PATENT DOCUMENTS

| 5,330,352 A * | 7/1994 | Watanabe et al. ........... 432/152 |
| 6,852,294 B2 * | 2/2005 | Doerksen .................... 422/200 |
| 2005/0028738 A1 | 2/2005 | Saito et al. |

FOREIGN PATENT DOCUMENTS

JP 63-94635 4/1988

(Continued)

OTHER PUBLICATIONS

International Search Report English Translation.

*Primary Examiner*—Charles D Garber
*Assistant Examiner*—Yasser A Abdelaziez
(74) *Attorney, Agent, or Firm*—McGinn IP Law Group, PLLC

(57) ABSTRACT

An object of the invention is to provide a substrate treatment device that can lengthen the maintenance cycle, and prevent any by-product from falling on substrates even if it is accumulated, and a manufacturing method of such a substrate treatment device, and an embodiment of the invention is directed, comprising: a treatment chamber that subjects a substrate to a treatment while keeping hold of it by a substrate retention member; a reaction tube that configures the treatment chamber; a heating device that is disposed around the reaction tube for heating the treatment chamber; and an exhaust tube that is linked to the reaction tube on an upper side than the substrate inside of the treatment chamber and is extended downward from the heating device, and exhausts a gas inside of the reaction tube in which an extension portion as a result of the extension is disposed away from the reaction tube.

17 Claims, 13 Drawing Sheets

FOREIGN PATENT DOCUMENTS

| | | |
|---|---|---|
| JP | 7-58037 | 3/1995 |
| JP | 9-27488 | 1/1997 |
| JP | 2002-75890 | 3/2002 |
| JP | 2002-305152 | 10/2002 |
| JP | 2002-343731 | 11/2002 |
| JP | 2003-209063 | 7/2003 |
| JP | 2005-57305 | 3/2005 |
| WO | WO 2005/050725 | 6/2005 |

* cited by examiner

VIEWING FROM ARROW B-B

LOSS HEAD OF R SECTION

| R/d | 1 | 2 | 3 | 4 | 5 |
|---|---|---|---|---|---|
| R(mm) | 24 | 48 | 72 | 96 | 120 |
| $\zeta$ (AT 90°) | 0.21 | 0.14 | 0.10 | 0.09 | 0.11 |
| $h_b$ | 0.130 | 0.129 | 0.146 | 0.172 | 0.215 |

LOSS HEAD OF STRAIGHT-TUBE SECTION

| R/d | 1 | 2 | 3 | 4 | 5 |
|---|---|---|---|---|---|
| l(mm) | 96 | 72 | 48 | 24 | 0 |
| h | 0.08 | 0.06 | 0.04 | 0.02 | 0.00 |

LOSS HEAD OF ENTIRE R SECTION AND PRESSURE REDUCTION

| R/d | 1 | 2 | 3 | 4 | 5 |
|---|---|---|---|---|---|
| $h_b+2h$ | 0.30 | 0.26 | 0.23 | 0.21 | 0.21 |
| p1-p2(Pa) | 1.67 | 1.42 | 1.28 | 1.20 | 1.20 |

LOSS HEAD WITH RIGHT-ANGLED BENDING

| ζ (AT 90°) | 1.129 |
|---|---|
| $h_b$ | 0.73 |
| p1-p2(Pa) | 4.07 | ced
SUBSTRATE TREATMENT DEVICE AND MANUFACTURING METHOD OF SEMICONDUCTOR DEVICE

TECHNICAL FIELD

The present invention relates to a substrate treatment device for subjecting a substrate to a heat treatment and a manufacturing method of a semiconductor device and, more specifically, to a substrate treatment device that manufactures a semiconductor device by subjecting a substrate such as silicon wafer and glass substrate to a substrate treatment including thin-film formation, impurity diffusion, annealing treatment, and etching, and a manufacturing method of the semiconductor device.

BACKGROUND ART

A substrate treatment device includes a sheet-fed substrate treatment device that performs a substrate treatment one by one, and a batch-fed substrate treatment device that performs a substrate treatment by the unit of a predetermined number of sheets. As one of the batch-fed substrate treatment device, there is a portrait-oriented substrate treatment device including a portrait-oriented treatment furnace.

FIG. 19 shows a treatment furnace 1 of a portrait-oriented substrate treatment device of a previous type.

The treatment furnace 1 is provided with a heater 2, and a reaction tube 3 disposed inside of the heater 2. The reaction tube 3 is configured to include a quartz-made outer tube 4, and a quartz-made inner tube 5 concentrically disposed inside of the outer tune 4. The outer tube 4 and the inner tube 5 are disposed upright on a metal-made inlet flange 6. The lower end of the inlet flange 6 forms a furnace port section 7, and the furnace port section 7 is closed to be air tight by a sealing cap 8.

The inner tube 5 and the lower portion of the inlet flange 6 configure a reaction chamber 9, and a cylindrical space 11 is configured among the outer tube 4, the upper portion of the inlet flange 6, and the inner tube 5. The cylindrical space 11 and the reaction chamber 9 are linked together at the upper end.

On the sealing cap 8, a substrate retention member (boat) 12 is disposed upright, and the boat 12 keeps hold of substrates (wafers) 13 to be in the horizontal position in many layers. The wafers 13 are housed in the reaction chamber 9 while being retained by the boat 12.

The lower portion of the inlet flange 6 is connected with a gas guide nozzle 14 that is linked to the reaction chamber 9, and the upper portion of the inlet flange 6 is connected with a gas exhaustion tube 15 that is linked to the cylindrical space 11.

The sealing cap 8 is supported to be able to move up and down by a boat elevator that is not shown, and the boat 12 is so configured as to be attached/removed to/from the reaction chamber 9 by the boat elevator. In the state that the boat 12 is being moved down by the boat elevator, a substrate moving mechanism that is not shown performs loading and removing of the wafers 13 with respect to the boat 12.

For a treatment of the wafers 13, in the state that the boat 12 keeping hold of the wafers 13 is housed inside of the reaction chamber 9, and in the state that the reaction chamber 9 is sealed by the sealing cap 8 to be air tight, the reaction chamber 9 is reduced in pressure down to a treatment pressure or is remained in the state of atmospheric pressure. In the state that the reaction tube 3 and the wafers 13 are heated up to a treatment temperature by the heater 2, a treatment gas is directed by the gas guide nozzle 14. The treatment gas coming from the lower portion of the inlet flange 6 moves up in the reaction chamber 9, and makes a U-turn at the upper end of the inner tube 5 to go down in the cylindrical space 11, thereby being exhausted from the upper portion of the inlet flange 6 via the exhaustion tube 15.

In the course of the treatment gas flowing on the surfaces of the wafers 13, any predetermined treatment such as film formation is applied.

As is shown in the drawing, the inlet flange 6 is exposed from the heater 2 and is made of metal, thereby resulting in high heat dissipation and easy temperature reduction.

Between the outer tube 4 and the inlet flange 6, a sealing member is provided for sealing air tight, and for the purpose of preventing the sealing member from being burnt, the portion of the inlet flange 6 in the vicinity of the sealing member is being cooled.

In the course of the substrate treatment, the treatment gas is guided from the lower portion of the inlet flange 6, and passes over the surfaces of the wafers 13 so that film formation is done. The gas through with the treatment as such (hereinafter, exhausted gas) is exhausted after going through the upper portion of the inlet flange 6.

In the course of the exhaust gas passing through the inlet flange 6 and being exhausted from the exhaust tube 15, the temperature is reduced. As a result, the upper portion of the inlet flange 6 becomes available for easy attachment of any reaction by-product, and thus attached reaction by-product corrodes the metal. Moreover, if a polyimide baking process is executed, the temperature is reduced when the polyimide gas vaporized as a result of baking is exhausted, thereby possibly resulting in liquefaction. The polyimide liquefied as such becomes a cause of pollution with respect to the wafers 13, and also a cause of shortening the maintenance cycle such as removing any attached polyimide.

Moreover, if a cleaning process is executed, the cleaning gas corrodes the inlet flange 6 being a metal member, and the metal member emits metal atoms such as Fe and Cu, whereby the wafers 13 are polluted by the emitted metal at the atomic level.

Especially when a heat treatment is applied to a plurality of substrates each coated with a polyimide material and a Polybenzoxazole (PBO: Polybenzoxazole) material using a portrait-oriented reaction furnace, at the time of the heat treatment, any gas generated from the polyimide material due to the heat is attached inside of the reaction furnace. This gas attachment is made after liquefaction to a portion where the temperature is lower than 200 ° C. to 300 ° C. such as an exhaust path in the reaction furnace. Because such a heat treatment is repeatedly executed in the reaction furnace, every time a heat treatment is performed, the by-product to be attached inside of the reaction furnace will be increased.

Patent Document 1: JP-A-10-223548

DISCLOSURE OF THE INVENTION

Problems that the Invention is to Solve

As described above, when a gas is made to flow from the lower portion to the upper portion of the inner tube disposed inside of the reaction tube (outer tube) of a double-tubed configuration, and when the gas is then exhausted by making it to flow down the exhaust path formed between the reaction tube and the inner tube, the lower portion of the exhaust path being low in temperature may be easily attached with the by-product. When any liquid attachment is accumulated at this portion, there may be a problem that the attachment overflows from the space between the inner tube and the portion where the inner tube is disposed into the space where substrates are accommodated, and falls on the substrates before the heat treatment or after the heat treatment.

As means for solving such problems, there is a method of wiping off any liquid attachment by maintenance, or removing any attachment by cleaning the reaction furnace after disassembly thereof. However, for such maintenance, there is a problem that the device has to be stopped in operation for a long time.

The invention is proposed to solve the problems described above, and an object thereof is to provide a substrate treatment device that can lengthen the maintenance cycle, and prevent any by-product from falling on substrates even if it is accumulated, and a manufacturing method of a semiconductor device.

Moreover, another object is to prevent any possible temperature reduction of an exhaust gas after a treatment, prevent by-product attachment and liquefaction of the gas after the treatment, and increase the serviceability ratio by preventing substrate pollution or by lengthening the maintenance cycle.

Means for Solving the Problems

In order to solve the above-described problems, a substrate treatment device of an aspect of the invention includes: a treatment chamber that subjects a substrate to a treatment while keeping hold of it by a substrate retention member; a reaction tube that configures the treatment chamber; a heating device that is disposed around the reaction tube for heating the treatment chamber; and an exhaust tube that is linked to the reaction tube on an upper side than the substrate inside of the treatment chamber and is extended downward from the heating device, and exhausts a gas inside of the reaction tube in which an extension portion as a result of the extension is disposed away from the reaction tube.

BEST MODE FOR CARRYING OUT THE INVENTION

Figure 1:
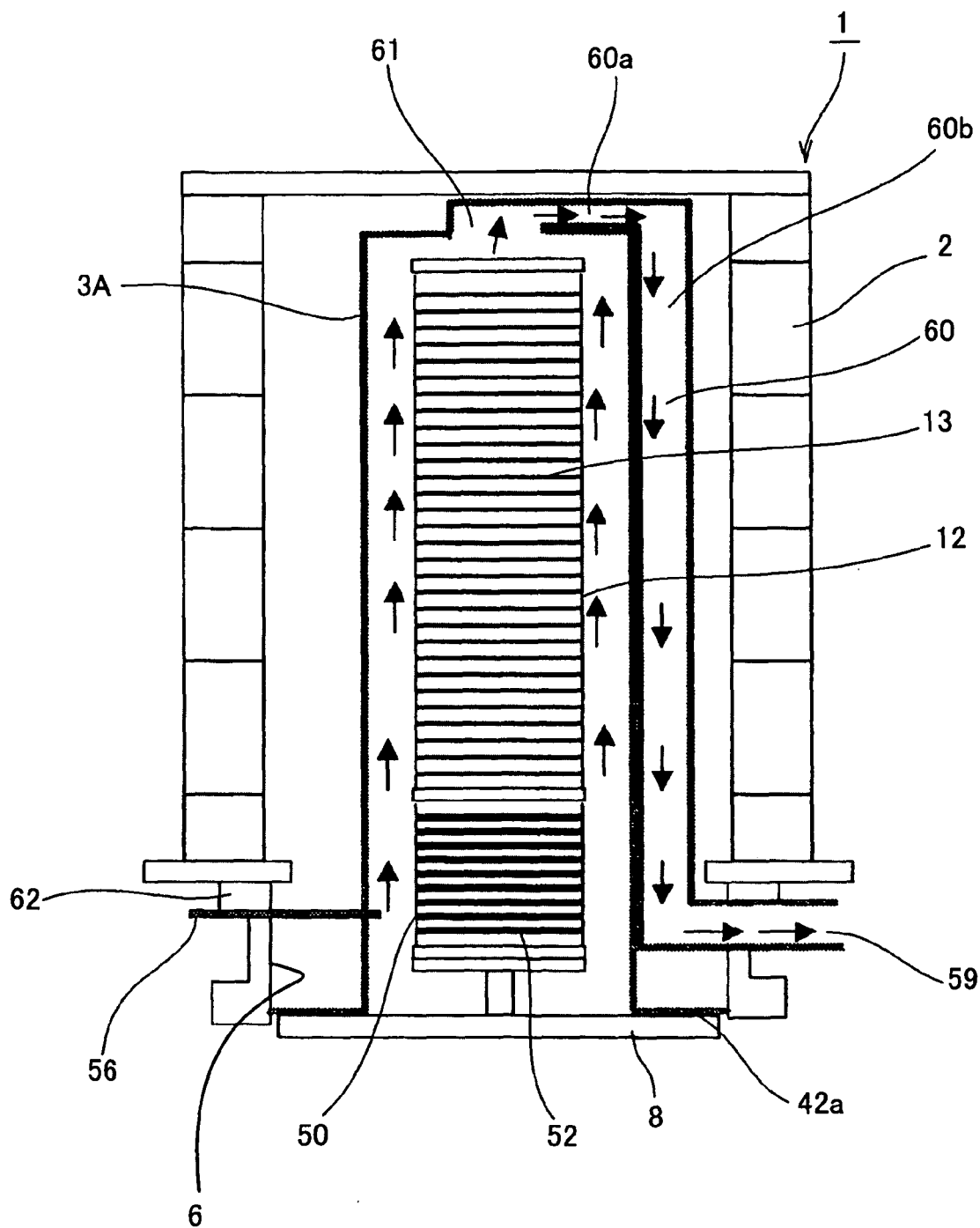
FIG. 1 is a cross sectional diagram showing a reaction furnace of a first embodiment of the invention.

In the below, embodiments of the invention are described by referring to the accompanying drawings. Note here that any same or similar components in the drawings are under the same reference numerals.

First Embodiment

FIG. 1 is a diagram showing an exemplary treatment furnace (reaction furnace) 1 of a first embodiment of the invention.

This treatment furnace 1 carries therein a quartz-made reaction tube 3A, and the reaction tube 3A is of a cylindrical shape whose lower end portion is left open. The open lower end portion of the reaction tube 3A is shaped like a flange, and the tip end of a flange 42a is linked to a support base 62 for placement. The area around the reaction tube 3A not including the support base 62 is provided with the heater 2.

The furnace port section being the area left open below the reaction tube 3A is so configured as to be sealed air tight when the sealing cap 8 comes in contact with the lower surface of the flange 42a via an O ring that is not shown. The sealing cap 8 is supporting the boat 12, and is able to move up and down together with the boat 12. Between the sealing cap 8 and the boat 12, a heat insulation plate support member 50 is provided.

This heat insulation plate support member 50 supports a plurality of quartz-made heat insulation plates 52 each in a substantially horizontal position in many layers at regular intervals. The boat 12 supports a plurality of wafers 13 each serving as a substrate for a treatment (hereinafter, simply referred also to as substrate) to be in a substantially horizontal position in many layers at regular intervals, and is loaded inside of the reaction tube 3A.

At a lower portion of the reaction tube 3A, a gas supply port (gas supply section) 56 is disposed as a piece for a gas supply to the inside thereof, and one end of the gas supply port 56 is guided to the outside of the treatment furnace 1 after going through the support base 62. At an upper portion of the reaction tube 3A, an exhaust port (exhaust section) 61 is formed to serve as an aperture for exhausting the gas provided by the gas supply port 56 to the outside of the reaction tube 3A. The outside of the reaction tube 3A is provided with a quartz-made gas exhaust tube 60 of a material same as that of the reaction tube 3A. The gas exhaust tube 60 is configured to include a horizontal portion 60a being an extension along the upper wall of the reaction tube 3A, and a vertical portion 60b being an extension down to the lower portion of the reaction tube 3A along the side walls of the reaction tube 3A.

One end of the horizontal portion 60a of the gas exhaust tube 60 is linked to the exhaust port 61 to come in contact therewith, and the other end thereof is linked to the vertical portion 60b to come in contact therewith. One end of the vertical portion 60b is linked to the horizontal portion 60a to come in contact therewith, and the other end thereof is disposed to the lower portion of the treatment furnace 1. One end thereof is linked to the other end of a gas exhaust port 59 protruding to the outside of the treatment furnace 1. On the side of an end of the gas exhaust port 59, there are an exhaust trap and an exhaust device that are not shown but similar to those of the previous device.

With such a configuration, the gas supplied from the gas supply port 56 to the lower portion of the reaction tube 3A moves up inside of the reaction tube 3A, and then is exhausted from the exhaust port 61 to the outside of the reaction tube 3A. The gas is then made to flow in the horizontal portion 60a of the gas exhaust tube 60 in the horizontal direction, and to move down the vertical portion 60b, thereby being exhausted from the lower portion of the treatment furnace 1 to the outside of the treatment furnace 1 via the gas exhaust port 59.

Figure 2:
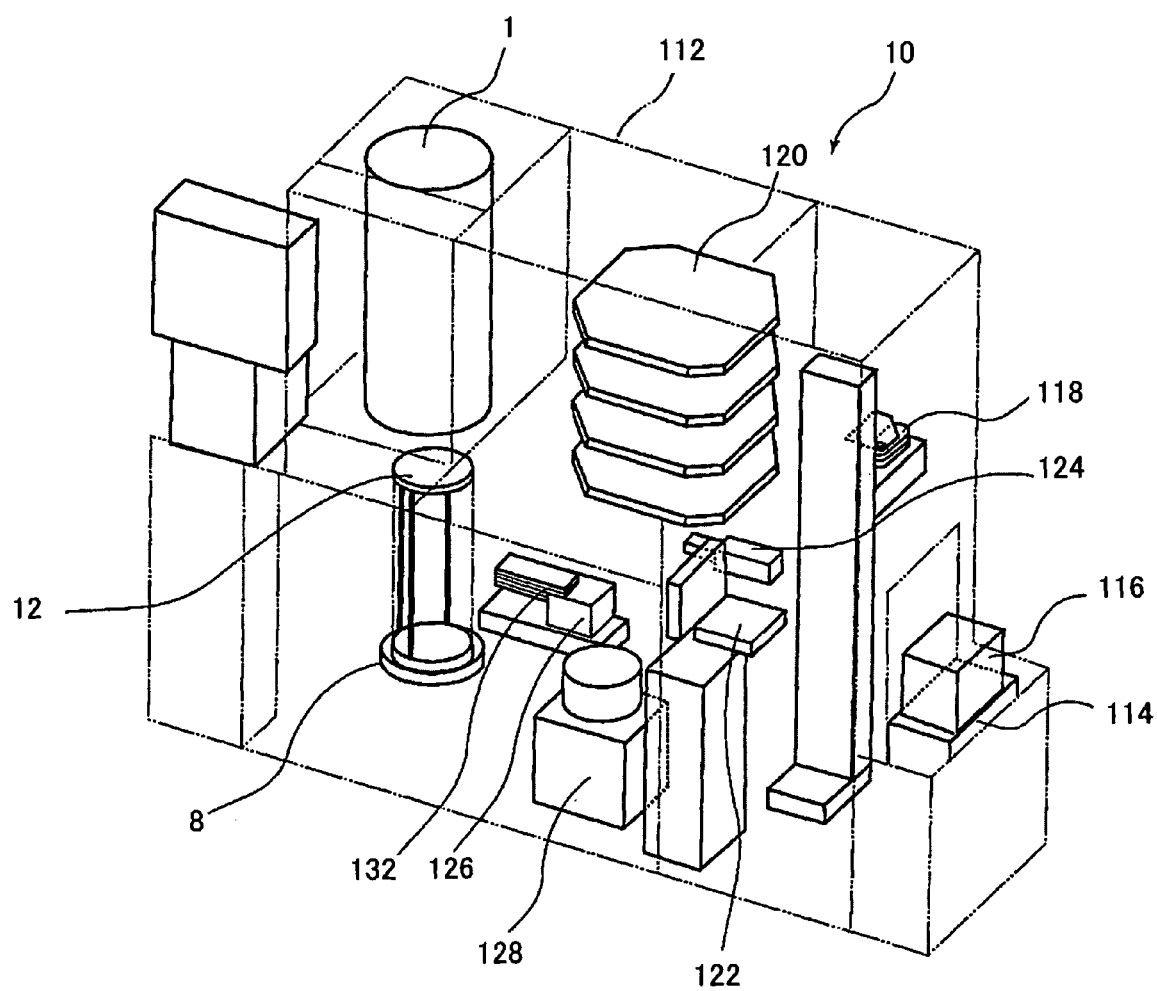
FIG. 2 is a schematic perspective diagram showing a substrate treatment device provided with the reaction furnace of the first embodiment of the invention.

Next, by referring to FIG. 2, an exemplary substrate treatment device 10 of the embodiment of the invention is shown. This substrate treatment device 10 is a batch-fed portrait-oriented substrate treatment device, and includes a chassis 112 in which main components are disposed. On the front surface side of this chassis 112, a pod stage 114 is connected, and to this pod stage 114, a pod 116 is transferred. The pod 116 carries therein 25 wafers 13 each serving as a substrate for a treatment, for example, and is set to the pod stage 114 in the state that the lid thereof that is not shown is closed.

At the position opposing the pod stage 114 on the front surface side in the chassis 112, a pod transfer device 118 is disposed. In the vicinity of this pod transfer device 118, a pod shelf 120, a pod opener 122, and a substrate piece detector 124 are disposed. The pod shelf 120 is disposed above the pod opener 122, and the substrate piece detector 124 is disposed adjacent to the pod opener 122.

The pod transfer device 118 transfers the pod 116 among the pod stage 114, the pod shelf 120, and the pod opener 122. The pod opener 122 is provided to open the lid of the pod 116, and the number of the wafers 13 inside of the lid-open pod 116 is detected by the substrate piece detector 124.

Moreover, the chassis 112 carries therein a substrate moving device 126, a notch aligner 128, and the substrate support member (boat) 12. The substrate moving device 126 has an arm (tweezer) 132 that can extract five wafers 13, for example, and by moving this arm 132, the wafers 13 are transferred among the pod located at the position of the pod opener 122, the notch aligner 128, and the boat 12. The notch aligner 128 detects a notch or an orientation flat formed to each of the wafers 13 so that the notches or the orientation flats of the wafer 13 are aligned at their specific positions.

Moreover, at the upper portion inside of the chassis 112 on the side of the rear surface thereof, the above-described treatment furnace 1 is disposed. Into this treatment furnace 1, the boat 12 loaded with a plurality of wafers 13 is transferred for a heat treatment.

Next, described are the effects of the substrate treatment device 10 configured as described above.

First of all, when the pod stage 114 is set with the pod 116 carrying therein a plurality of wafers 13 each coated with a polyimide material, the pod transfer device 118 transfers the pod 116 from the pod stage 114 to the pod shelf 120 for storage in the pod shelf 120. Next, by the pod transfer device 118, the pod 116 stored in this pod shelf 120 is transferred to the pod opener 122 for setting, and by this pod opener 122, the lid of the pod 116 is opened so that the substrate piece detector 124 detects the number of the wafers 13 accommodated in the pod 116.

Next, the substrate moving device 126 extracts the wafers 13 from the pod 116 located at the position of the pod opener 122 for placement on the notch aligner 128. In this notch aligner 128, detection of notch is made with the rotation of the wafers 13, and based on the detected information, notches of the wafers 13 are aligned at the same position. Next, by the substrate moving device 126, the wafers 13 are extracted from the notch aligner 128 for placement on the boat 12.

After the wafers 13 of a batch are placed on the boat 12 in this manner, the boat 12 loaded with a plurality of wafers 13 is loaded into the treatment furnace 1 with the temperature set to be about 200° C., for example, and the inside of the treatment furnace 1 is sealed by the sealing cap 8. Next, the temperature in the furnace is increased up to the temperature for the heat treatment, and the treatment gas is directed into the reaction tube 3A from the gas supply port 56. For the treatment gas, nitrogen ($N_2$) is used. When the wafers 13 are subjected to the heat treatment, the wafers 13 are heated to be at a temperature equal to or higher than about 320° C., for example.

During the heat treatment for the wafers 13, the nitrogen gas supplied into the reaction tube 3A from the gas supply port 56 moves up inside of the reaction tube 3A, and then is exhausted to the outside of the reaction tube 3A from the exhaust port 61. The gas is then made to flow in the horizontal portion 60a of the gas exhaust tube 60 in the horizontal direction, and then is made to move down the vertical portion 60b, thereby being exhausted to the outside of the treatment furnace 1 after passing through the gas exhaust port 59 from the lower portion of the treatment furnace 1.

After the heat treatment for the wafers 13 is completed, the temperature in the furnace is reduced to a temperature of about 200° C., for example, and then the boat 12 supporting the wafers 13 through with the heat treatment is unloaded from the treatment furnace 1. Until every wafer 13 supported by the boat 12 gets cold, the boat 12 is then put on standby at any predetermined position.

Next, after the wafers 13 of the boat 12 being on standby are cooled down to the predetermined temperature, the substrate moving device 126 extracts the wafers 13 from the boat 12 for transfer and accommodation into any vacant pod 116 set to the pod opener 122. Next, the pod transfer device 118 transfers the pod 116 carrying therein the wafers 13 to the pod shelf 120 or to the pod stage 114, and this is the end of the series of processes.

During the heat treatment for the wafers 13, the gas of a solvent of the polyimide material coated on the surfaces of the wafers 13 is exhausted, and thus by-product is generated. Thus generated by-product is exhausted to the outside after going through the gas exhaust port 59 together with the nitrogen gas. Moreover, the reaction tube 3A and the gas exhaust tube 60 are formed as a piece before reaching the gas exhaust port 59, and unlike the previous reaction tube of a double-tubed configuration, the exhaust path has no space for linkage to the reaction tube 3A. Accordingly, even if there is a low-temperature portion below the vertical portion 60b of the gas exhaust tube 60, and even if this low-temperature portion is attached with any liquid by-product, the liquid by-product will flow and drop to the side of the gas exhaust port 59. As such, no overflow is caused into the inside of the reaction tube 3A, and no attachment is caused to the wafers 13. In this manner, the maintenance cycle of the treatment furnace 1 can be lengthened compared with the previous type.

Moreover, because one end side of the gas exhaust port 59 is provided with an exhaust trap as described above, the liquid by-product exhausted from the gas exhaust port 59 is stored by the exhaust trap.

Comparison Example

Figure 3:
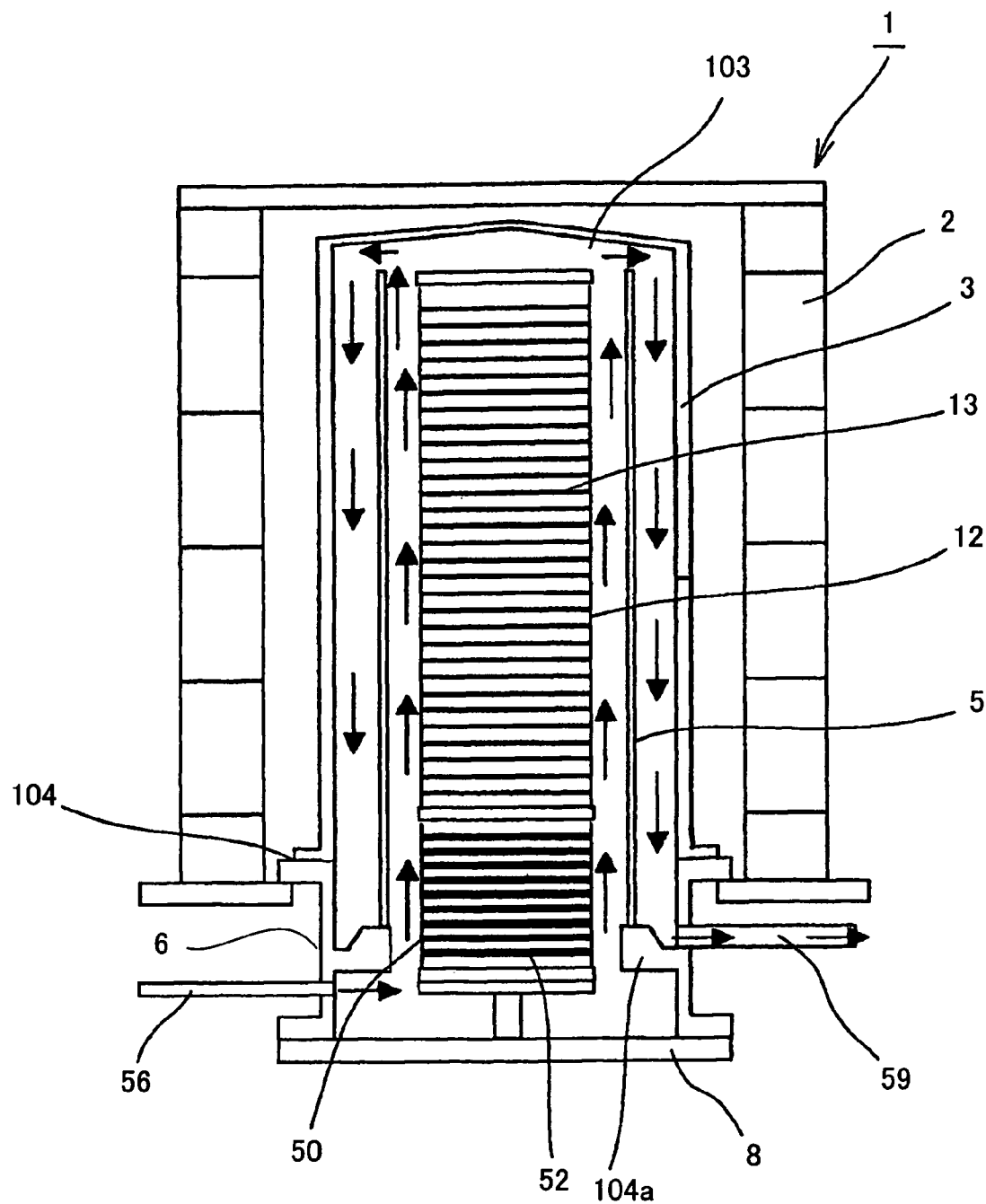
FIG. 3 is a cross sectional diagram showing a comparison example of the reaction furnace.

FIG. 3 shows a comparison example of the treatment furnace (reaction furnace) 1.

Note that, in this treatment furnace 1, any configuration same as that of the above-described embodiment is not described twice, and only any portion different from that of the embodiment will be described.

This treatment furnace 1 includes the quartz-made inner tube 5 inside of the quartz-made reaction tube 3 (outer tube 4), and this reaction tube 3 is of a cylindrical shape whose upper end portion is closed but lower portion is left open. The inner tube 5 is shaped like a cylinder whose upper end portion and lower end portion are both open. At below the reaction tube 3, a quartz-made or metal-made adaptor 104 is disposed for supporting the reaction tube 3 and the inner tube 5.

This adaptor 104 is shaped like a cylinder whose upper end portion and lower end portion are both left open, and these open upper and lower end portions are each shaped like a flange. With the upper surface of the upper-end-portion flange of the adaptor 104, the lower surface of the lower-end-portion flange of the reaction tube 3 comes in contact, and by the reaction tube 3 and the adaptor 104, a reaction container 103 is formed. Moreover, with an inner protrusion portion 104a of the adaptor 104, the lower surface of the lower-end-portion flange of the inner tube 5 is coming in contact. The adaptor 104 is separately provided with, to be a piece, the gas supply port 56 and the gas exhaust port 59.

In the reaction container 103, the heater 2 is disposed around the reaction tube 3 not including the adaptor 104, and when the sealing cap 8 comes in contact with the lower surface of the lower-end-portion flange of the adaptor 104 via an O ring, the treatment furnace 1 is so configured as to be closed air tight.

Described next are the effects of the substrate treatment device 10 including the treatment furnace 1 of the comparison example.

Note here that, also as to the effects, any effects same as those of the above-described embodiment are not described twice, and only a step of guiding and exhausting a nitrogen gas to/from the treatment furnace 1 being a part different from that of the embodiment is described.

The nitrogen gas to be supplied to the treatment furnace 1 during the heat treatment for the wafers 13 is guided from the gas supply port 56 into the reaction container 103, and then is moved up inside of the inner tube 5. The nitrogen gas moved up to the upper end portion of the inner tube 5 is made to flow in the direction of the side walls of the reaction tube 3, and then is made to moved down between the inner tube 5 and the reaction tube 3 as an exhaust path, thereby being exhausted from the gas exhaust port 59.

In the treatment furnace 1 of the comparison example, the by-product generated during the heat treatment of the wafers 13 is liquefied and attached to the outside of the lower portion of the inner tube 5 where the exhaust path is low in temperature. By repeating such a heat treatment for the wafers 13, the amount of the by-product to be attached to the outside of the lower portion of the inner tube 5 is increased, and the by-product accumulated at this portion may overflow into the reaction container 103 by going through the space between the inner tube 5 and the inner protrusion portion 104a of the adaptor 104.

As such, at the time point when the amount of the by-product accumulated on the lower portion side of the inner tube 5 is increased, the inner tube 5 is removed for cleaning and wiping. Alternately, oxygen may be made to flow from the gas supply port 56 to heat the reaction tube 3 up to about 800° C. so that the by-product attached to the inner tube 5, the reaction tube 3, and the boat 12 is burned for exhaustion. However, at the lower portion of the inner tube 5, the heating temperature is low, and there thus may be a case that the by-product may not be burnt and thus left.

In the first embodiment described in detail above, the substrate treatment device as below is described.

That is, the substrate treatment device of this embodiment is provided with a reaction tube that applies a heat treatment to a substrate coated with a polyimide material, a gas supply section that is disposed to the lower portion of the reaction tube, and supplies a gas from the lower portion of the reaction tube into the inside of the reaction tube, an exhaust section that is disposed to the upper portion of the reaction tube and exhausts the gas provided into the inside of the reaction tube from the upper portion of the reaction tube to the outside, and a gas exhaust section (gas exhaust tube) that is linked to the exhaust section, and is disposed to the outside of the reaction tube to exhaust the gas exhausted from the exhaust section in the direction of the lower portion of the reaction tube.

The manufacturing method of the semiconductor device of this embodiment includes a step of moving a substrate coated with a polyimide material into the inside of a reaction tube, a step of subjecting the substrate to a treatment inside of the reaction tube, and a step of moving out the substrate after the treatment from the reaction tube. In the step of subjecting the substrate to the treatment, a gas is supplied from the lower portion of the reaction tube to the inside of the reaction tube, and after the gas is exhausted from the exhaust section disposed at the upper portion of the reaction tube to the outside of the reaction tube, the gas is exhausted in the direction of the lower portion of the reaction tube by going through a gas exhaust section (gas exhaust tube) linked to the exhaust section.

As described in detail in the above, according to the first embodiment of the invention, similarly to the previous gas flow, a gas can be made to flow from the lower portion of the reaction tube toward the direction of the upper portion thereof. The gas guided as such is exhausted at the upper portion of the reaction tube by going through the gas exhaust section (gas exhaust tube) located at the outside of the reaction tube, and thus the by-product is attached to the gas exhaust section being a low-temperature portion. Moreover, because the gas exhaust section is so configured as not to be linked to the reaction tube on the downstream side from the portion where the gas exhaust section is connected, even if any by-product is attached to the gas exhaust section, the attachment flows toward the downstream side of the gas exhaust section, and no overflow is caused into the inside of the reaction tube, thereby leading to a possibility of no falling on the substrates. This accordingly enables to lengthen the maintenance cycle.

Second Embodiment

Figure 4:
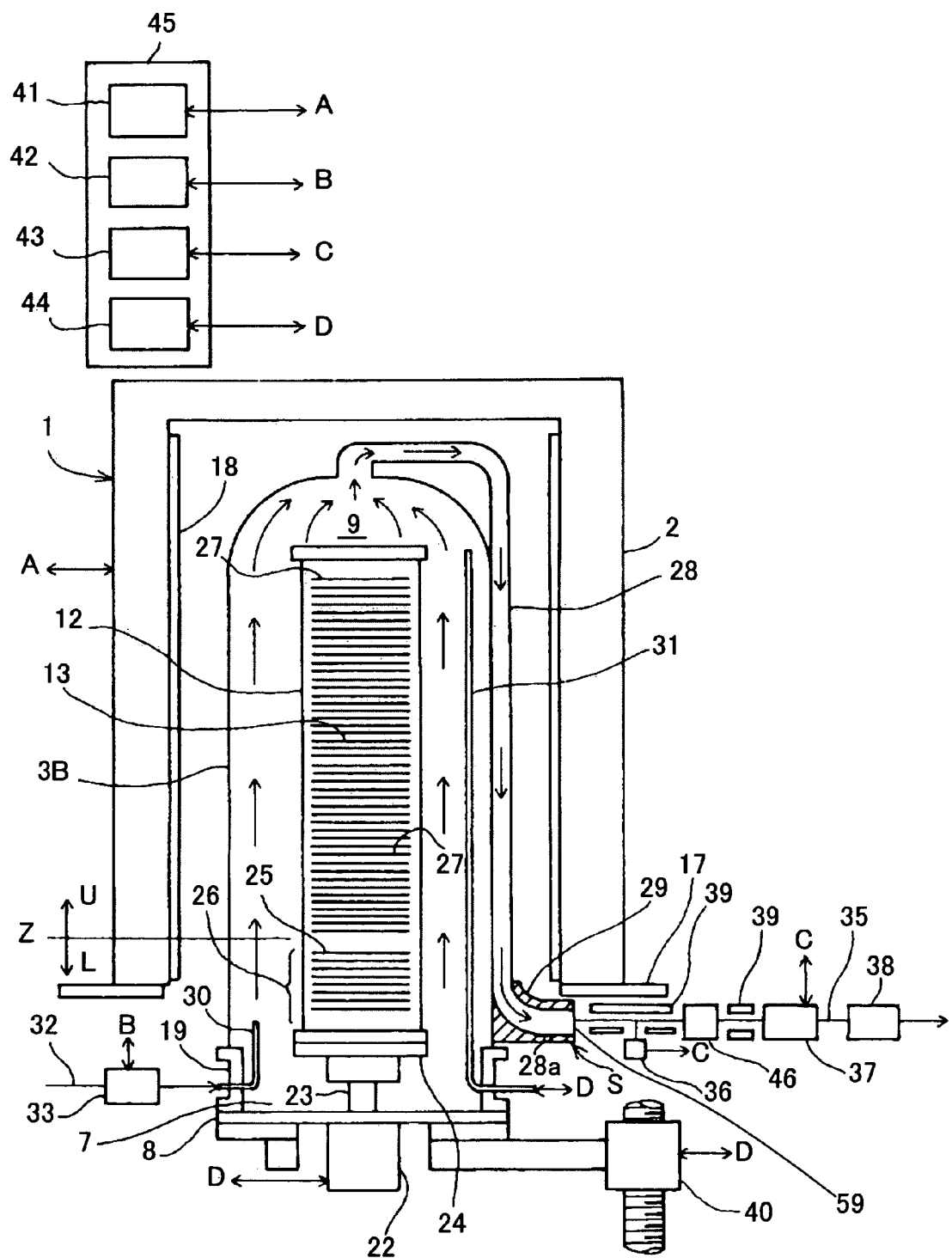
FIG. 4 is a cross sectional diagram showing a reaction furnace of a second embodiment of the invention.

Described next is a second embodiment. FIG. 4 shows an exemplary treatment furnace for use in a substrate treatment device of the second embodiment.

The heater (referred also to as heating device) 2 is provided upright on a heater base 17. The heater 2 is provided with a heat generator 18 on the inner wall surface, and the heat generator 18 is divided into any predetermined number of zones in the vertical direction. The zones being the division results are each provided individually so that heating is controlled.

A reaction tube 3B is provided upright on an inlet flange 19 that is supported by the heater base 17 or the upper surface of a spare chamber (not shown) provided at the lower portion, and between the reaction tube 3B and the above-described inlet flange 19, a sealing member is sandwiched to be air tight. The aperture at the lower end of the above-described inlet flange 19 forms the furnace port section 7, and the furnace port section 7 is closed to be air tight by the sealing cap 8. The reaction tube 3B and the sealing cap 8 configure the air-tight reaction chamber 9, and the reaction chamber 9 carries therein the boat 12. For the reaction tube 3B, quartz and silicon carbide being the heat-resistant materials are used, and for the sealing cap 8 and the inlet flange 19, a metal material such as stainless steel is used.

At the lower portion of the boat 12, any needed number of heat insulation plates 25 are loaded so that a heat insulation section 26 is formed. At the upper side of the heat insulation section 26, and at the upper portion of the boat 12, any required number of dummy wafers 27 are to be loaded as appropriate respectively.

Through the ceiling portion of the reaction tube 3B, preferably through the center of the ceiling portion thereof, an exhaust tube 28 whose diameter is sufficiently small with respect to the reaction tube 3B is linked. The exhaust tube 28 is assumed as being made of a material same as that of the reaction tube 3B, and a portion of connection therebwteen is made as a piece by welding, for example.

The exhaust tube 28 is directed downward above the reaction tube 3B, and extends downward along the reaction tube 3B. A lower end portion (extension portion) 28a is disposed with a space from the reaction tube 3B, and is bent in the horizontal direction, thereby extending from the lower end of the heater 2 or from the area in the vicinity of the lower end thereof in the horizontal direction. The exhaust tube 28 comes in contact with the reaction tube 3B, and preferably comes in close contact therewith, thereby being able to receive the heat from the reaction tube 3B, and the extension portion 28a is covered by a heat insulation material 29 for thermal insulation.

As the placement state with a space, as shown in the drawing, the extension portion 28a may be curved to be placed with a space, tilted to be placed with a space, or bent by degrees, for example.

Figure 5:
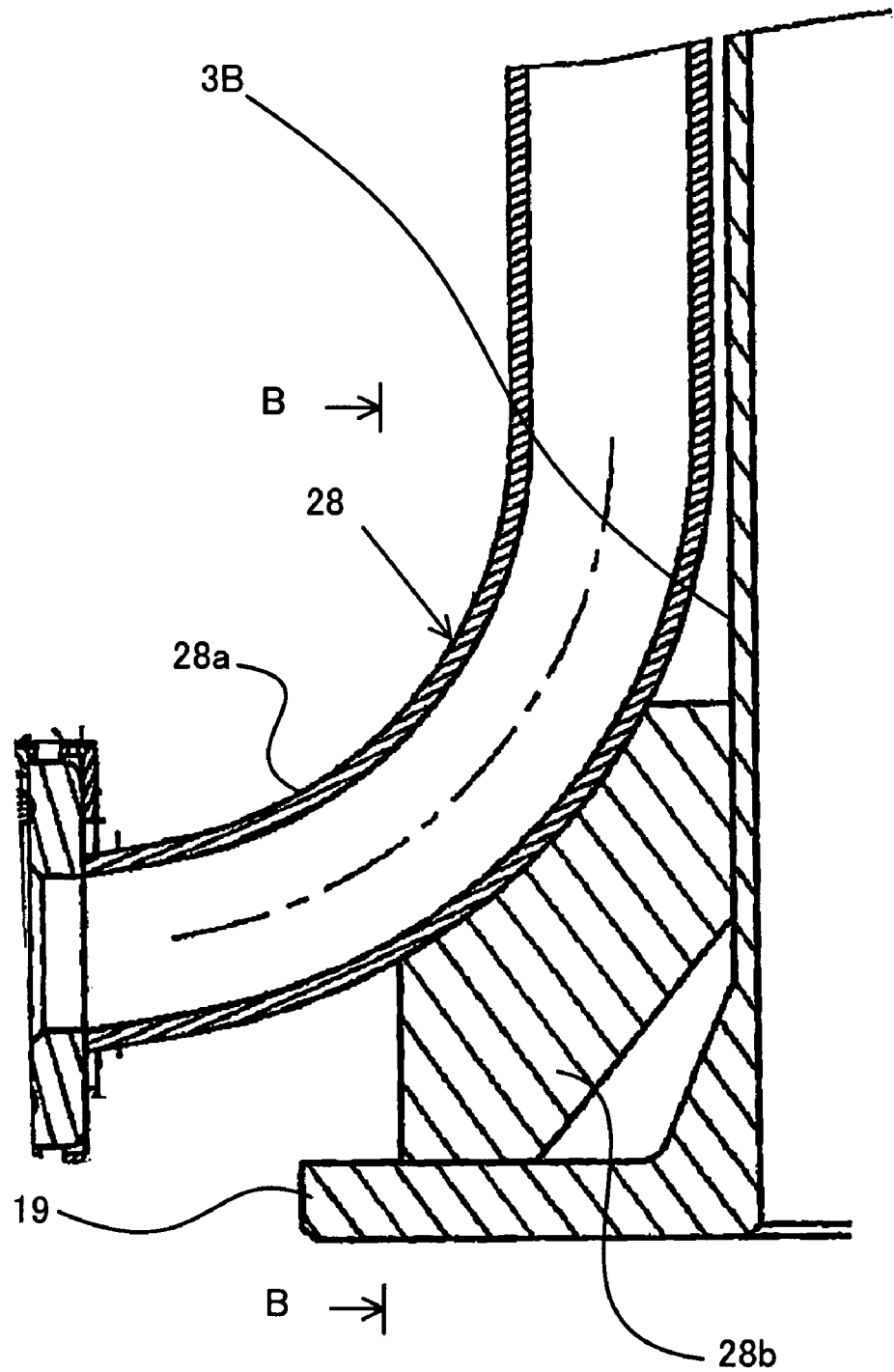
FIG. 5 is a side view of an extension portion of an exhaust tube.
Figure 6:
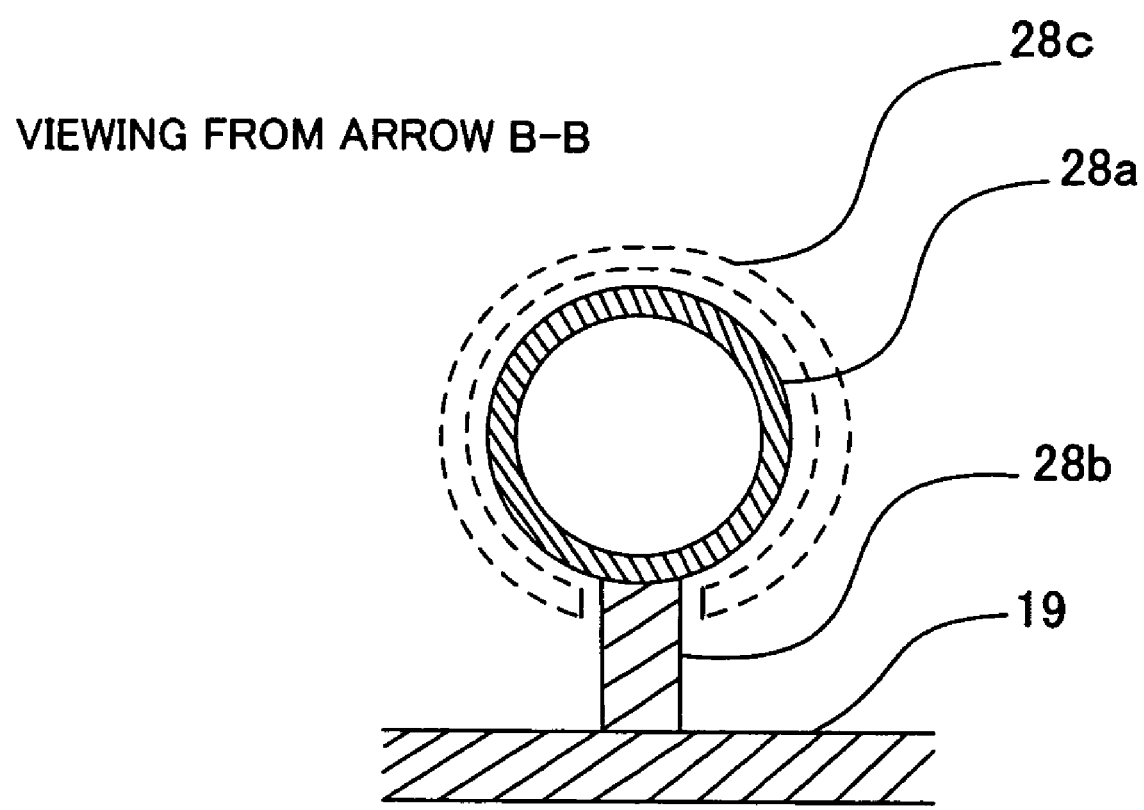
FIG. 6 is a cross sectional diagram cut along a line B-B of FIG. 5.

Herein, the support configuration of the extension portion 28a is described in detail by referring to FIGS. 5 and 6. FIG. 5 is a side view of the area in the vicinity of the extension portion, and FIG. 6 is a diagram viewed from an arrow B-B of FIG. 5. Alternatively, the extension portion 28a may be provided with a support portion (support body) 28b serving as a reinforcement rib among the extension portion 28a, the side wall at the lower end portion of the reaction tube 3B, and the inlet flange 19. When the support portion 28b (reinforcement rib) is provided, any portion coming in contact with the extension portion 28a but not including the reinforcement rib is preferably covered by a heat insulation material or a tube heater 28c.

A treatment gas guide nozzle 30 is provided by going through the inlet flange 19 to be air tight, and a temperature sensor 31 is provided by going through the inlet flange 19 to be air tight. The temperature sensor 31 is extended upward along the inner wall of the reaction tube 3B so that the temperature detection is enabled for each of the zones. The temperature sensor 31 and the heater 2 are electrically connected to a temperature control section 41, which will be described later. The temperature control section 41 independently controls the state of heat generation of the heat generator 18 in such a manner that the temperature reaches a predetermined value in each of the zones at any required timing based on the detection result of the temperature sensor 31.

Moreover, the heating range of the heater 2 is at least from the lower end position of the dummy wafers 27 to the upper end of the exhaust tube 28, and the zone control by the heat generator 18 achieves the substantially uniform heating.

The treatment gas guide nozzle 30 is connected with a gas supply tube 32, and the gas supply tube 32 is connected to a gas supply source such as treatment gas source or purge gas source that is not shown. The gas supply tube 32 is provided with a gas flow rate controller 33, and the gas flow rate controller 33 is electrically connected to a flow rate control section 42 that will be described later. The flow rate control section 42 controls the gas flow rate controller 33 at any required timing to derive any predetermined rate of flow for a gas to be supplied.

The exhaust tube 28 is connected with an external exhaust tube 35, and the external exhaust tube 35 is provided with a pressure detector 36, a pressure adjuster 37, and an exhaust device 38 such as vacuum pump and ejector for exhaustion with a slightly reduced pressure. As an alternative to the exhaust device 38, a treatment furnace may be provided for diffusion, annealing, baking, and oxidization at a level of about atmospheric pressure. Moreover, to the portion where the exhaust tube 28 and the external exhaust tube 35 are connected, and to the area around the external exhaust tube 35, a heating heater 39 is provided so as to heat the gas not to be lower in temperature than a predetermined temperature for flowing through the external exhaust tube 35.

The pressure detector 36 and the pressure adjuster 37 are electrically connected to the pressure control section 43 that will be described later. Based on the detection result of the pressure detector 36, the pressure control section 43 controls the pressure control section 43 at any required timing so as to derive any predetermined pressure for the reaction chamber 9.

On the upstream side of the pressure adjuster 37, an exhaust trap 46 is provided, and as to the external exhaust tube 35, the heating heater 39 is provided around the external exhaust tune 35 from the connection portion with the extension portion 28a to the connection portion with the exhaust trap 46. The exhaust gas is forcefully cooled by the exhaust trap 46, and any reaction product found in the exhaust gas generated as a result of reaction in the treatment chamber is collected after liquefaction and curing thereof, thereby preventing any attachment of the reaction product in the pressure adjuster 37, the external exhaust tube 35, and the exhaust device 38, all of which are located on the downstream side.

The sealing cap 8 is provided air tight with a boat rotation mechanism 22, and a rotation shaft 23 of the boat rotation mechanism 22 protrudes to the reaction chamber 9. At the upper end of the rotation shaft 23, a boat reception base 24 is provided, and the boat reception base 24 is placed thereon with the boat 12. During a treatment, the boat rotation mechanism 22 subjects the boat 12 to constant-speed rotation at a predetermined speed to achieve the uniform treatment for the wafers 13.

The sealing cap 8 is supported by a boat elevator 40 to be able to be required, and by being moving up and down by the boat elevator 40, the boat 12 is attached/removed to/from the above-described reaction chamber 9.

The boat rotation mechanism 22 and the boat elevator 40 are electrically connected to a drive control section 44, and the drive control section 44 controls the boat rotation mechanism 22 and the boat elevator 40 so as to allow any predetermined operation at any predetermined timing.

The temperature control section 41, the flow rate control section 42, the pressure control section 43, and the drive control section 44 are under the control of a main control section 45, whereby the main control section 45 controls the substrate treatment device in its entirety.

Next, described is a method of forming a thin film on the wafers 13 by CVD as one step in the manufacturing process of a semiconductor device using the treatment furnace 1 of the configuration described above. Note here that, in the description below, the components configuring the substrate treatment device are under the control of the above-described main control section 45 in terms of operation.

After the predetermined number of wafers 13 are loaded to the boat 12, the boat 12 is moved up by the boat elevator 40 for loading into the reaction chamber 9. In this state, the sealing cap 8 closely closes the furnace port section 7 to be air tight.

The exhaust device 38 performs vacuum exhaustion to derive any desired pressure (degree of vacuum) for inside of the reaction chamber 9. At this time, the pressure of the reaction chamber 9 is detected by the pressure detector 36, and based on the detected pressure, the pressure adjustor 37 is so controlled that the pressure in the pressure chamber 9 reaches a predetermined pressure. Moreover, the temperature sensor 31 detects the temperature in the reaction chamber 9, and based on the detected temperature, the heating state by the heater 2 is controlled by the temperature control section 41 in such a manner as to achieve any predetermined temperature for the reaction chamber 9. Thereafter, by the boat rotation mechanism 22, the wafers 13 are rotated together with the boat 12.

Thereafter, the gas provided by a treatment gas supply source (not shown) and controlled by the gas flow rate controller 33 to be of any predetermined rate of flow is guided into the reaction chamber 9 from the treatment gas guide nozzle 30 via the gas supply tube 32. Thus guided gas moves up the reaction chamber 9, and is made to flow to the exhaust tube 28 from the center of the ceiling of the reaction tube 3B, thereby being exhausted after going through the exhaust tube 28. When passing through the reaction chamber 9, the gas comes in contact with the surfaces of the wafers 13, and at this time, a thin film is deposited (deposition) on each of the surfaces of the wafers 13 by the thermal CVD reaction.

With the lapse of a preset treatment time, an inert gas comes from an inert gas supply source (not shown) so that the gas in the reaction chamber 9 is replaced with the inert gas, and the pressure in the reaction chamber 9 is put back to the normal pressure level.

Thereafter, the sealing cap 8 is moved down by the boat elevator 40 so that the furnace port section 7 is open, and the wafers 13 through with the treatment are transferred to the outside of the reaction chamber 9 from the furnace port section 7 while being retained by the boat 12. Thereafter, the treatment-through wafers 13 are moved out from the boat 12 by a substrate moving device that is not shown.

Note here that, as an example, the treatment requirements for a wafer treatment in the treatment furnace of this embodiment are exemplified by, for film formation of $Si_3N_4$ film, for example, the treatment temperature of 650 to 780° C., the treatment pressure of 10 to 50 Pa, the gas type and the flow rate of gas supply being $SiH_2Cl_2$ (dichlorsilane) 240 sccm, $NH_3$ (ammonia) 720 sccm, and others, and such treatment requirements are each kept constant to be a predetermined value in each value range so that the wafers are subjected to a treatment.

Moreover, in a polyimide baking process, for example, exemplified are the treatment temperature of 300 to 320° C., the treatment pressure of about the atmospheric pressure, and the gas type being $N_2$ (nitrogen) 50 l/min. Such treatment requirements are kept constant to be a predetermined value in each value range so that the wafers are subjected to a treatment.

In the course of a substrate treatment, the gas guided from the treatment gas guide nozzle 30 moves up the reaction chamber 9 for the substrate treatment, and the exhaust gas flows out from the center of the ceiling of the reaction tube 3B, thereby flowing into the exhaust tube 28 and moving down the exhaust tube 28.

The exhaust tube 28 is heated by the heat generator 18, and receives the heat from the reaction tube 3B of a large heat capacity, and in the course of moving down the exhaust tube 28, the exhaust gas is heated by the heat generator 18 and the reaction tube 3B.

Because being not exhausted via the inlet flange 19, the exhaust gas is not cooled by the inlet flange 19, and is exhausted from the exhaust tube 28 at a high temperature. Moreover, the extension portion 28a is disposed away from the exhaust tube 28 and is beyond the heating range for the heater 2, but is remained heat-insulated by the heat insulation material 29. Moreover, the connection portion between the exhaust tube 28 and the external exhaust tube 35, and the external exhaust tube 35 are both being heated by the heating heater 39 so that the temperature reduction can be suppressed minimum for the exhaust gas flowing through the extension portion 28a.

Moreover, unlike previously, the exhaust gas is not exhausted via the inlet flange 19, and is not cooled by the inlet flange 19. Accordingly, the exhaust gas is prevented from being liquefied by cooling so that attachment to the inlet flange 19 can be prevented, and the inlet flange 19 can be protected from corrosion by any attached liquid drops.

Furthermore, the inlet flange 19 disposed only on the gas guiding side is located perfectly away from the extension portion 28a of the exhaust tube 28. This thus allows cooling with no need to consider the liquefaction of the exhaust gas, and the temperature of the inlet flange 19 can be reduced down to the temperature that can suppress any possible damages to be caused by a reaction gas and a cleaning gas.

More preferably, the inlet flange 19 and the sealing cap 8 may be made of a heat-resistant non-metal material such as quartz and silicon carbide, or the inlet flange 19 and the sealing cap may be each provided with, for covering, a protection cover made of quartz and silicon carbide on the surface exposed to the side of the treatment chamber so that any possible metal damages to be caused by a reaction gas and a cleaning gas can be prevented, thereby being able to prevent any possible metal pollution of the wafers 13 at the atomic level.

Moreover, for the maintenance of the treatment chamber, only the lower portion of the treatment chamber is needed for the task, and no task is required at the place with the height using a stepladder or others, thereby increasing the operability. What is more, the task can be completed only by a person, and the time required for the maintenance is short so that the cost for maintenance is reduced.

Note here that the substrate treatment device can be applied to both a substrate treatment under the atmospheric pressure and a substrate treatment under a reduced pressure.

Next, about suppression of temperature reduction for an exhaust gas in this embodiment of the invention, the analysis result is described by referring to FIGS. 7 to 10.

Figure 7:
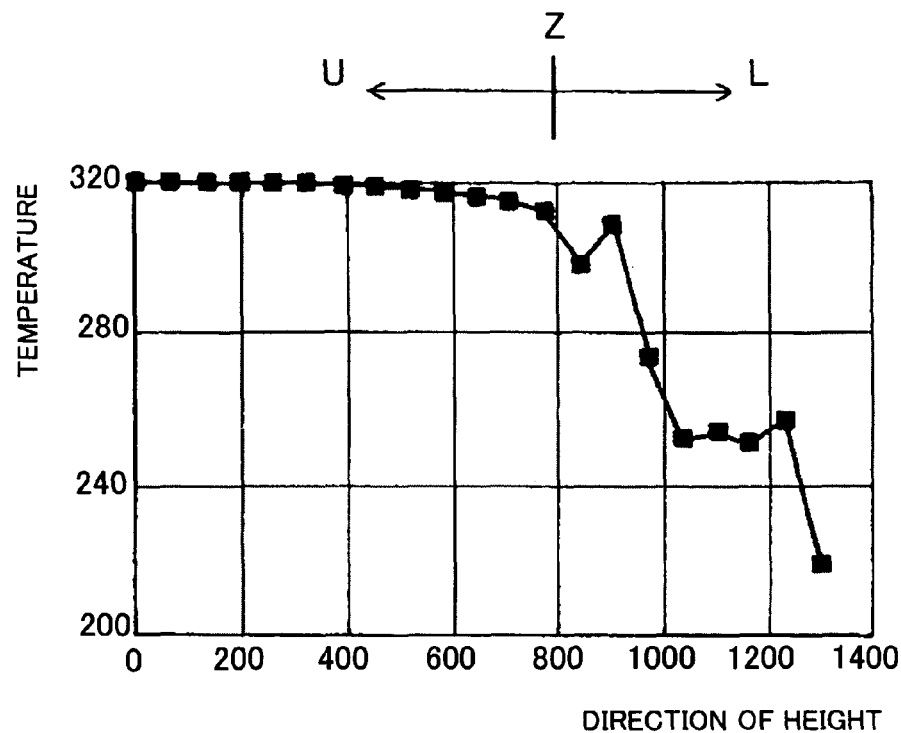
FIG. 7 is a diagram showing the temperature distribution in a vertical direction in a reaction chamber in a previous substrate treatment device.
Figure 8:
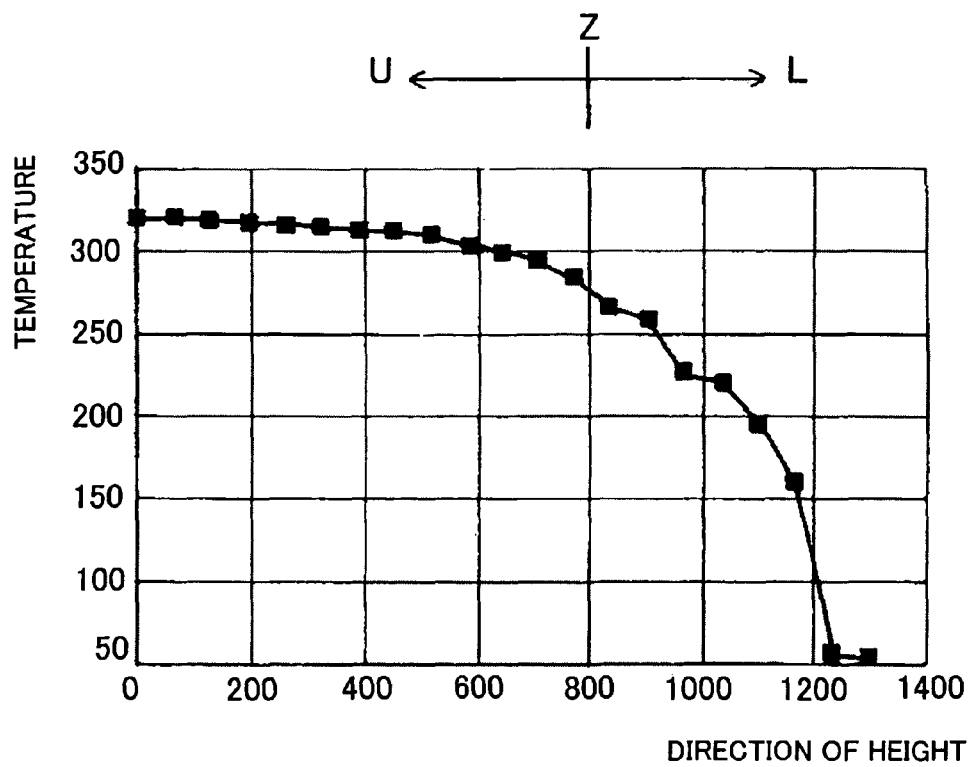
FIG. 8 is a diagram showing the temperature distribution in a vertical direction in a reaction chamber in the substrate treatment device of the embodiment.

FIG. 7 shows the temperature distribution in the vertical direction of the reaction chamber 9 in the previous substrate treatment device, and FIG. 8 shows the temperature distribution in the vertical direction of the reaction chamber 9 in the substrate treatment device of this embodiment.

Figures 18, 19:
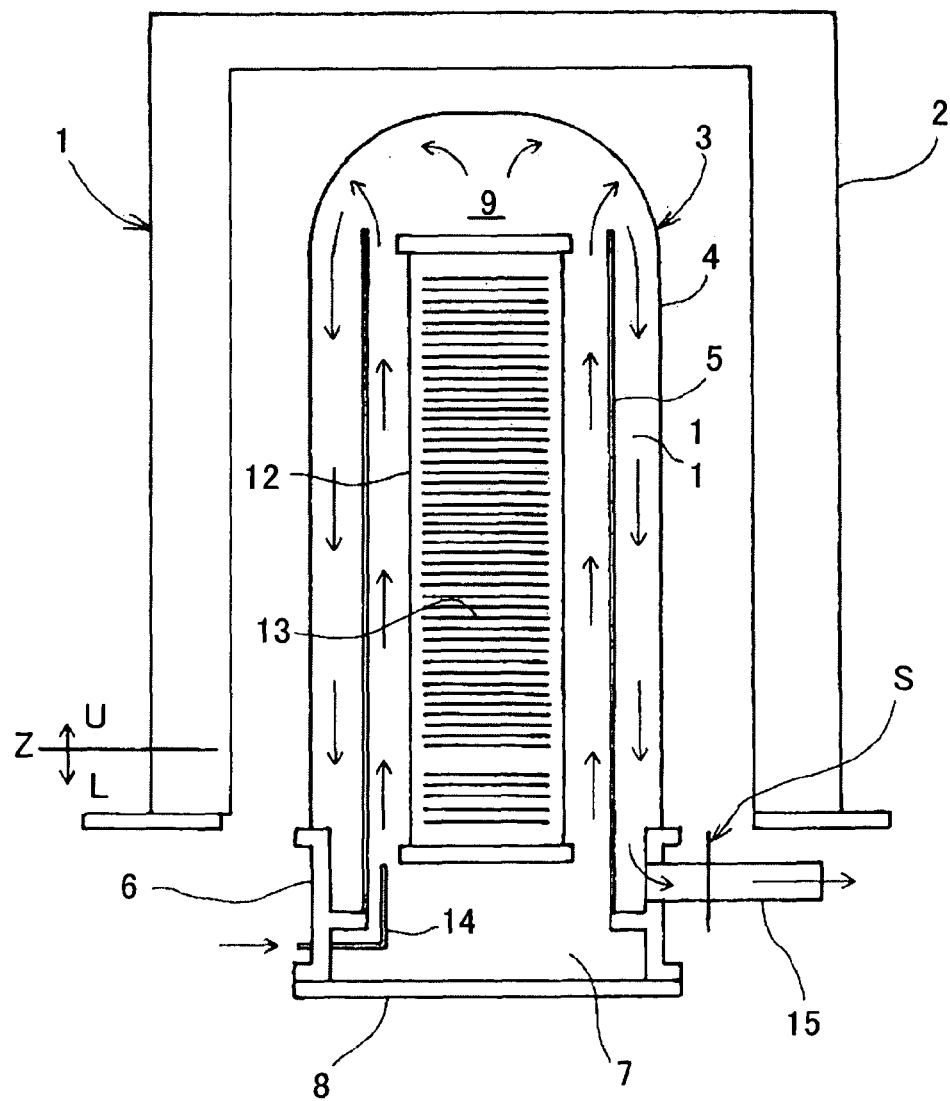
FIG. 18 is a diagram showing a loss head with right-angled bending.
FIG. 19 is a side view of an exemplary treatment furnace of a previous type.

In FIGS. 7 and 8, the lateral axis shows the vertical direction of the reaction chamber 9, and in FIGS. 7 and 8, the position indicated by L corresponds to the position of Z in FIGS. 4 and 19, and in FIGS. 7 and 8, the area on the left side from Z corresponds to the upper portion (U) of the reaction chamber 9 in FIGS. 4 and 19. In FIGS. 7 and 8, the area on the right side from Z corresponds to the lower portion (L) of the reaction chamber 9 in FIGS. 4 and 19.

Through comparison between FIGS. 7 and 8, in this embodiment, compared with the previous, improvements are observed in terms of temperature reduction and temperature distribution at the lower end of the reaction chamber 9.

Figure 9:
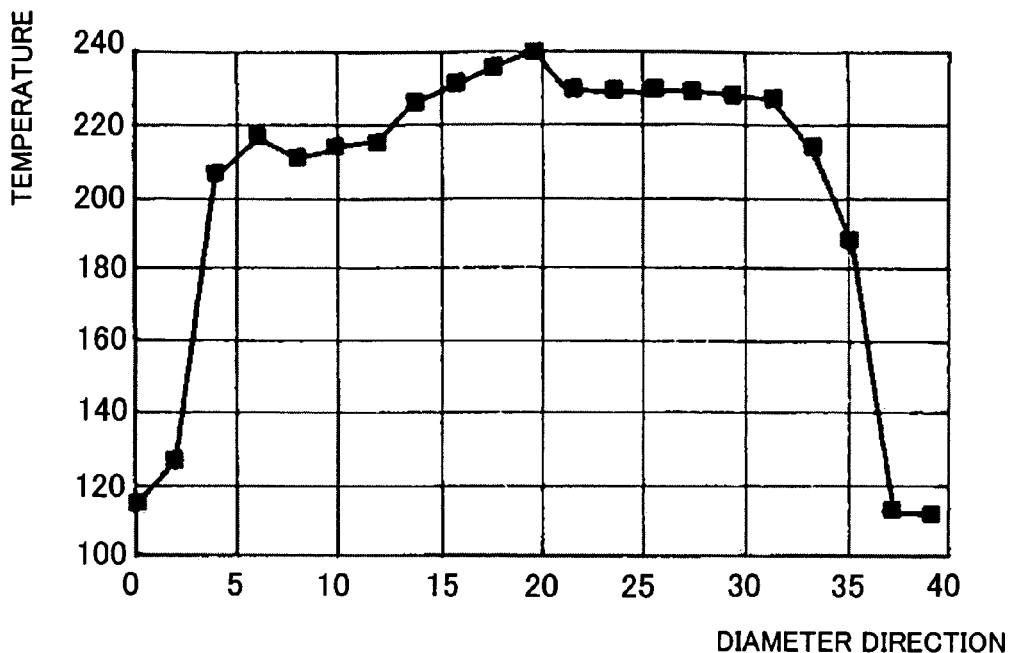
FIG. 9 is a diagram showing the temperature distribution in a diameter direction of the previous substrate treatment device (FIG. 19) at the cross section (S) of an exhaust tube 15.
Figure 10:
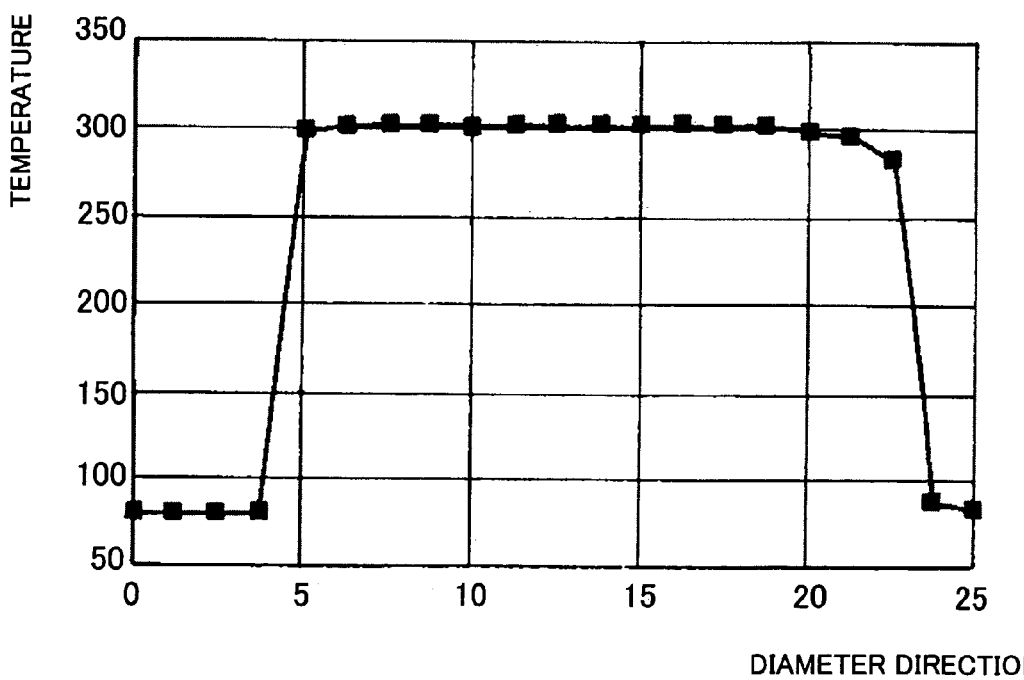
FIG. 10 is a diagram showing the temperature distribution in a diameter direction of the substrate treatment device of the embodiment (FIG. 4) at the cross section (S) of an extension portion 28a of an exhaust tube 28.

FIGS. 9 and 10 each show the temperature distribution at an outlet for the exhaust gas from the treatment furnace 1. FIG. 9 shows the temperature distribution in the previous substrate treatment device (FIG. 19) on the cross section (S) of the exhaust tube 15 in the diameter direction, and FIG. 10 shows the temperature distribution in the substrate treatment device (FIG. 4) of this embodiment on the cross section (S) of the extension portion 28a of the exhaust tube 28 in the diameter direction.

Moreover, the comparison between FIGS. 9 and 10 tells that the exhaust gas has the temperature of substantially 230° C. at the outlet of the exhaust gas. Moreover, some disturbance is observed in the temperature distribution, thereby leading to an estimation that there are some disturbance in the exhaust temperature.

On the other hand, in this embodiment, the temperature distribution is uniform at the outlet for the exhaust gas, and the temperature of the exhaust gas is about 300° C. Accordingly, in this embodiment, it is known that the temperature of the exhaust gas is high and stable.

As such, with the embodiment executed, the temperature of the exhaust gas at the outlet thereof is stable at a high temperature, thereby being able to prevent any attachment of the exhaust gas to the extension portion 28a after liquefaction thereof caused by the temperature reduction. Especially when a polyimide baking process is executed with respect to the wafers, the polyimide gas vaporized as a result of baking is prevented from being liquefied that is often caused by temperature reduction at the exhaust tube 28, especially at the extension portion 28a. As such, the maintenance cycle can be lengthened for cleaning and exchanging the reaction tube, for example.

Addenda

Moreover, the Second Embodiment Includes the Following Embodiments.

(Addenda 1) A substrate treatment device, comprising: a treatment chamber that subjects a substrate to a treatment while keeping hold of it by a substrate retention member; a reaction tube that configures the treatment chamber; a heating device that is disposed around the reaction tube to heat the treatment chamber; and an exhaust tube that has an outer diameter smaller than an outer diameter of the reaction tube, is linked to the reaction tube on the side upper than the substrate in the treatment chamber in the heating device, is extended downward from the heating device, and exhausts a gas inside of the reaction tube.

(Addenda 2) The substrate treatment device of Addenda 1 in which the exhaust tube is connected with the reaction tube at the upper end of the reaction tube.

(Addenda 3) The substrate treatment device of Addenda 1 in which the heating device includes a heat generator on the inner wall, and the heat generator is disposed at least from the side lower than the substrate held by the substrate retention member to the reaction tube and to the side upper than the upper end of the reaction tube.

(Addenda 4) The substrate treatment device of Addenda 1 in which the exhaust tube is welded to the reaction tube for linkage.

(Addenda 5) The substrate treatment device of Addenda 1 in which the exhaust tube is so disposed that the center axis of the exhaust tube comes on the center axis line of the reaction tube.

(Addenda 6) The substrate treatment device of Addenda 1 in which the extension portion of the exhaust tube on the side lower than the heating device is bent by degrees from the reaction tube toward the outside.

(Addenda 7) The substrate treatment device of Addenda 1 in which the extension portion of the exhaust tube on the side lower than the heating device is curved from the reaction tube toward the outside.

(Addenda 8) The substrate treatment device of Addenda 6 or 7 in which a heating heater is provided to a connection portion located on the downstream side of the extension portion (Addenda 9) The substrate treatment device of Addenda 8 in which the heating heater is provided to the peripheral of an exhaust path connected to the connection portion.

(Addenda 10) The substrate treatment device of Addenda 1 in which the exhaust tube and the reaction tube are each made of quartz.

(Addenda 11) The substrate treatment device of Addenda 1 that is further provided with: an inlet flange that keeps hold of the lower end of the reaction tube; a lid body that closes the aperture portion at the lower end of the inlet flange; and gas supply means that is provided to the inlet flange for a gas supply into the treatment chamber.

(Addenda 12) A manufacturing method of a semiconductor device that performs a treatment using a substrate treatment device, comprising: an exhaust device that is connected to the downstream side of an exhaust tube; a treatment chamber that subjects a substrate to a treatment while keeping hold of it by a substrate retention member; a reaction tube that configures the treatment chamber; a heating device that is disposed around the reaction tube to heat the treatment chamber; and an exhaust tube that has an outer diameter smaller than an outer diameter of the reaction tube, is connected to the reaction tube on the side upper than the substrate in the treatment chamber in the heating device, is extended downward from the heating device, and exhausts a gas inside of the reaction tube. The method includes the steps of: heating the treatment chamber by the heating device; subjecting the substrate to the treatment in the treatment chamber while keeping hole of it by the substrate retention member; and exhausting the gas in the reaction tube from the exhaust tube.

(Addenda 13) A substrate treatment device, comprising: a treatment chamber that subjects a substrate to a treatment while keeping hold of it by a substrate retention member; a reaction tube that configures the treatment chamber; a heating device that is disposed around the reaction tube to heat the treatment chamber; and an exhaust tube that has an outer diameter smaller than an outer diameter of the reaction tube, is linked to the reaction tube on the side upper than the substrate in the treatment chamber in the heating device, is extended downward from the heating device, and exhausts a gas inside of the reaction tube. In the device, the extension portion of the exhaust tube extending downward from the heating device is related to the substrate treatment device that is disposed away from the reaction tube, and a heat insulation material is provided around the extension portion.

(Addenda 14) A manufacturing method of a semiconductor device, comprising the steps of: heating, by a heating device disposed around a reaction tube, a treatment chamber configured by the reaction tube; subjecting a substrate to a treatment in the treatment chamber while keeping hold of it by a substrate retention member; and exhausting a gas inside of the reaction tube from an exhaust tube that has an outer diameter smaller than an outer diameter of the reaction tube, is linked to the reaction tube on the side upper than the substrate in the treatment chamber in the heating device, and is extended downward from the heating device.

According to the embodiment, the device, comprising: a treatment chamber that subjects it to a treatment while keeping hold of the substrate by a substrate retention member; a reaction tube that configures the treatment chamber; a heating device that is disposed around the reaction tube to heat the treatment chamber; and an exhaust tube that has an outer diameter smaller than an outer diameter of the reaction tube, is linked to the reaction tube on the side upper than the substrate in the treatment chamber in the heating device, is extended downward from the heating device, and exhausts a gas inside of the reaction tube. As such, the exhaust gas is exhausted while being heated by the heating device and the reaction tube, the temperature reduction is suppressed for the exhaust gas, and the liquefaction and any attachment of liquid drops as a result of any temperature reduction of the exhaust gas can be prevented.

Moreover, according to the embodiment, the extension portion of the exhaust tube extending downward from the heating device is disposed away from the reaction tube, and the extension portion is provided with a heat insulation material therearound so that any possible temperature reduction can be prevented for the extension portion of the exhaust tube.

Also according to the embodiment, the method, comprising the steps of: heating, by a heating device disposed around a reaction tube, a treatment chamber configured by the reaction tube; subjecting a substrate to a treatment in the treatment chamber while keeping hold of it by a substrate retention member; and exhausting a gas inside of the reaction tube from an exhaust tube that has an outer diameter smaller than an outer diameter of the reaction tube, is connected to the reaction tube on the side upper than the substrate in the treatment chamber in the heating device, and is extended downward from the heating device. There are thus satisfactory effects such as the exhaust gas is exhausted while being heated by the heating device and the reaction tube, the temperature reduction is suppressed for the exhaust gas, and the liquefaction and any attachment of liquid drops as a result of any temperature reduction of the exhaust gas can be prevented.

Third Embodiment

Figure 11:
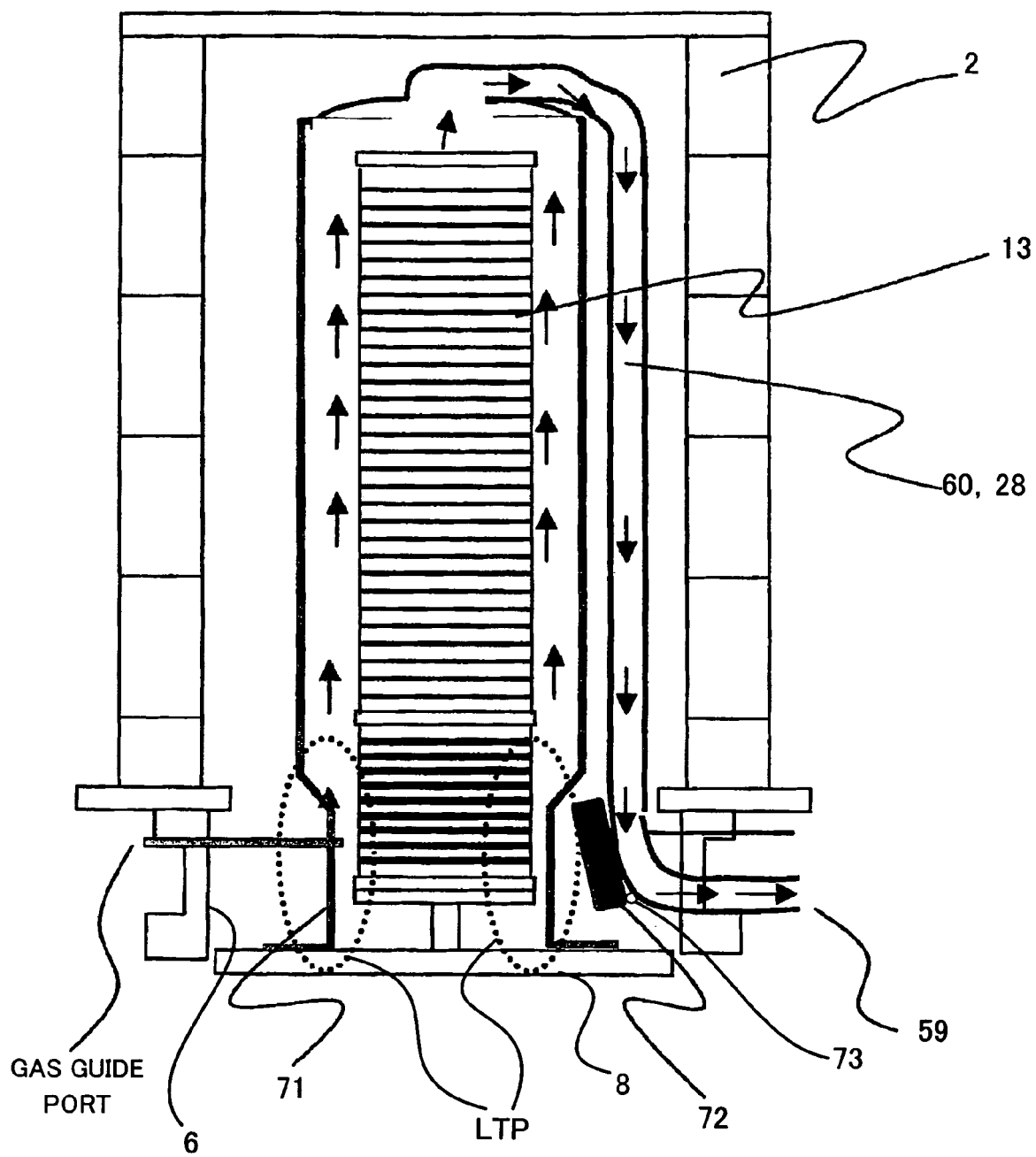
FIG. 11 is a cross sectional diagram showing a reaction furnace of a third embodiment of the invention.

FIG. 11 shows a treatment furnace of a substrate treatment device of a third embodiment.

Figure 12:
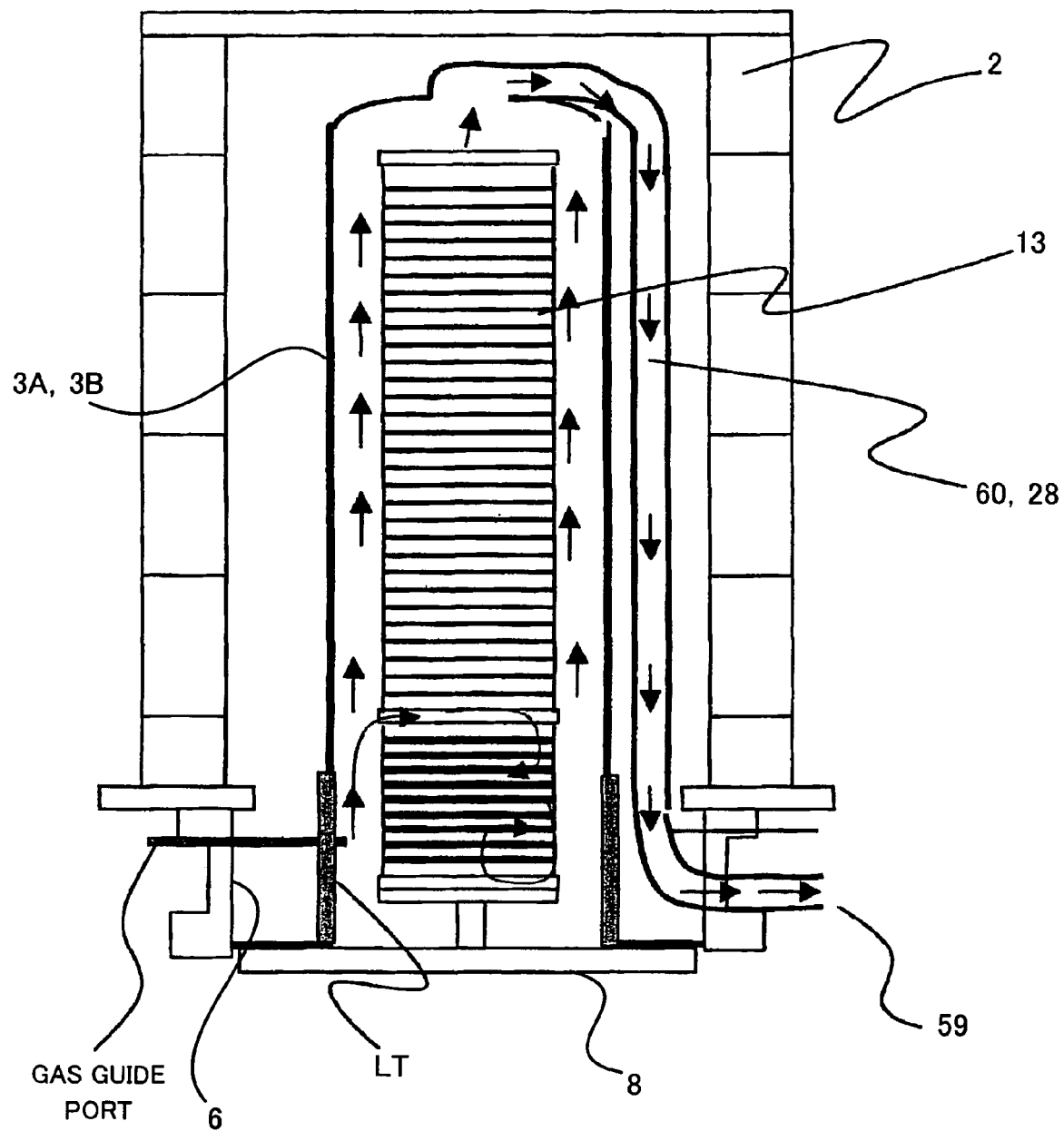
FIG. 12 is a diagram for illustrating a treatment furnace for use to show the advantages of the third embodiment of the invention compared with the first and second embodiments thereof.

In the configurations of the first and second embodiments, especially when a heat treatment is applied to a plurality of wafers that are each coated with an organic material or are not yet completely free from any organic material thereon, the gas including the material coated on the wafers or the gas including the by-product generated from the remaining is moved backward and diffused to the upstream side from the wafers in the furnace so that the gas is attached inside of the treatment chamber. FIG. 12 shows such a state.

If this is the case, when the temperature on the side walls in the treatment chamber is equal to or higher than 200° C., the gas will become like a film (layer), and thus it will not easily peeled off or scattered. However, at any portion of the side walls (low-temperature portion at the furnace port) LTP with the temperature lower than 200° C., it will be easily peeled off. Or any powder-like by-product is generated, and is easily scattered. Such by-product is increased as the treatment is repeatedly performed, and the amount of scattering is also increased. In the end, it is observed as a foreign substance on the wafers in the manufacturing process.

As means for solving such problems, the by-product has been wiped off, and the components have been washed. However, if with such attachment wiping-off and component washings the device has to be stopped in operation for a long time.

In the third embodiment, described is a case where such problems can be also solved.

As shown in FIG. 11, in the third embodiment, a throttle section (throttle portion) 71 is provided to a low-temperature portion in the treatment chamber (lower portion of the reaction container) LTP located on the upstream side of the space where the wafers are placed for the purpose of preventing scattering of a material coated on the wafers or a gas including by-product generated from the remaining to the low-temperature portion of the furnace port of the reaction container (treatment chamber). The throttle portion 71 is preferably provided entirely around the reaction container.

As such, the configuration enables to prevent any scattering as a result of back-flow to the low-temperature portion, and prevent scattering mixture of any foreign substance onto the wafers as a result of the increase of the by-product in the treatment chamber, especially on the upstream side from the wafers. Moreover, with the configuration, the gas supply is made from the throttled low-temperature portion so that the gas coming from the wafer area with any by-product is prevented from flowing backward, and is prevented from scattering to the low-temperature portion. With such a configuration, scattering mixture of any foreign substance can be prevented to a further degree onto the wafers as a result of the increase of the by-product in the treatment chamber, especially on the upstream side from the wafers. Note here that if the throttle section 71 described above is formed as a piece with the reaction chamber, the heat conduction is eased, and the low-temperature portion is favorably reduced in size.

Moreover, the throttle section 71 of the low-temperature portion in the treatment chamber in the vicinity of the furnace port serves also as a heat space of an exhaust tube for a treatment gas including a large amount of by-product. That is, it becomes possible to dispose an exhaust tube heater (also referred to as auxiliary heating heater or auxiliary heating device) 72 to the outside of this throttle section 71.

Accordingly, with such a configuration, the gas coming from the wafer area with the by-product is prevented from moving backward and from scattering to the low-temperature portion while the placement space is being kept in the exhaust tube heater 72. Accordingly, it becomes possible to prevent the scattering mixture of any foreign substance onto the wafers as a result of the increase of the by-product in the treatment chamber, especially on the upstream side from the wafers, and to lengthen the maintenance cycle of the reaction tube.

Between the exhaust tube heater 72 and the exhaust tubes 60 and 28, a temperature sensor 73 is disposed. Based on the temperature detected by the temperature sensor 73, the temperature control section 41 (FIG. 4) applies heating control over the heating control section so as to derive the temperature of allowing no attachment of by-product in the exhaust tube, for example, the temperature being equal to or higher than 300° C. and being substantially the same as that of the substrate treatment area. Note here that the exhaust tube heater 72 is not restrictive to such temperature control over the temperature control section 41, and other than that, the temperature control section may be individually provided.

Note here that, as shown also in the second embodiment (refer to FIGS. 5 and 6), as to the exhaust tube heater 72, if a heater or a heat insulation material is provided not only to the area around the exhaust tube but also to the area entirely around the throttle section 71, it is considered good because any possible attachment and liquefaction of the by-product can be prevented on the upstream side from the wafers. Herein, the exhaust tube heaters 60 and 28 may poor in terms of controllability over the temperature but offer constant effects of heat insulation when they are used as the heat insulation materials.

A study is now given of the pressure loss specifically described in the above second and third embodiments with respect to the radius of curvature of the exhaust tubes 60 and 28.

The exhaust tube is disposed along the side walls of the reaction tube. Therefore, if the internal diameter of the exhaust tube is minimized, the space between the heater disposed around the reaction tube and the reaction tube can be reduced so that the temperature control can be applied by the heater with more ease inside of the reaction tube, and any energy waste can be reduced in the heater due to heat dissipation from the lower portion of the space.

On the other hand, when the flow path of the exhaust tube is reduced, or when the flow velocity is reduced, it becomes difficult to keep any desired amount of exhaustion. Especially the curved portion of the exhaust tube will easily suffer from the pressure loss, and if the flow velocity is reduced, any predetermined amount of exhaustion cannot be kept. Moreover, when the flow velocity is reduced, the curved portion will be easily attached with the by-product, and if with such by-product attachment, an out gas is generated from the by-product and the flow path is reduced in width, thereby resulting in much less amount of exhaustion. Especially at the extension portion below the heater 2, the heat from the heater 2 is hardly received, and the by-product is easily accumulated. In a case where the support portion 28b is provided, for example, with the heat conduction from the support portion 28b, the area and therearound is easily reduced in temperature, and the by-product is easily accumulated to the area. In consideration thereof, the curved portion of the exhaust tube may be so configured as not to cause reduction of flow velocity, that is, as to reduce any possible pressure loss as much as possible.

Described below is the calculation of pressure loss.

Reynolds Number $Re = vd/\upsilon$

Figures 13, 14, 15:
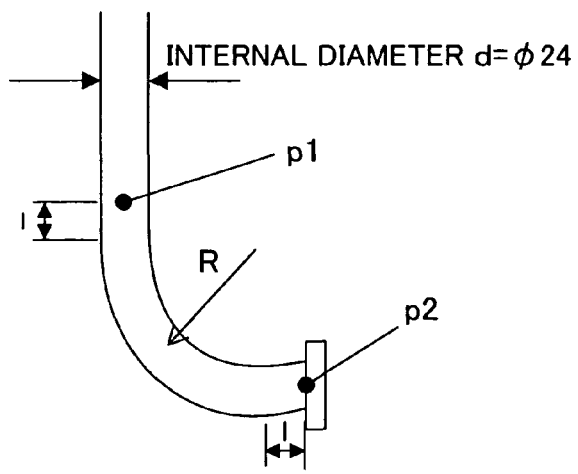
FIG. 13 is a diagram for illustrating tube parameters for a case of bent bending.
FIG. 14 is a diagram showing a loss head of an R section.
FIG. 15 is a diagram showing a loss head of a straight-tube section.
Figures 16, 17:
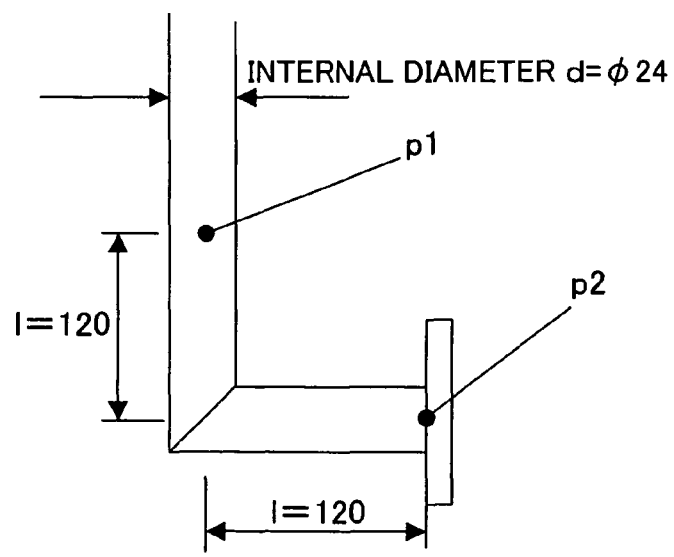
FIG. 16 is a diagram showing the loss head of the R section in its entirety and the pressure reduction thereof.
FIG. 17 is a diagram showing tube parameters for a case of right-angled bending.

Loss Head of Straight-Tube Section $h = \lambda \cdot l \cdot v^2 / 2gd$ $h = (p1 - p2)/\rho g$ Loss Head by Bending $h_b = \zeta_b v^2 / 2\ g$ $= (\zeta + \lambda \cdot 1/d) v^2 / 2\ g$ Re: 1385.68
λ: 0.05
Entire Loss Head: $h_b + 2h$
Pressure Reduction (pa) from $P_1$ to $P_2$, $P_1 - P_2$
υ: kinematic viscosity (51.96 mm²/s (when N2 is 300° C.)
λ: Coefficient of Tube Friction (=64/Re, assumption with state of layer flow)
l: Length of Straight-Tube Section
v: Average Flow Velocity (presumably, pressure of atmospheric pressure −50 Pa, and about 3000 mm/s with exhaust tube of 300° C.)
d: Internal diameter of Tube (presumably φ24 mm)
p: Pressure
ρ: Density
R: Bent bending r (bend radius of the entire R bending portion)
Re: Reynolds Number
μ: Viscosity (29.55 μPa·s, N2: 300° C.)
ζ: Loss Coefficient of Bent Bending The calculation above is aimed to calculate the optimum dimension of the bending R of the exhaust tube, and is made with an assumption that the internal diameter of the exhaust tube is 24 mm, and the fluid is $N_2$ of 300° C. FIG. 13 shows the tube parameters with the case of bent bending, FIG. 14 shows the loss head of the R section, FIG. 15 shows the loss head of the straight-tube section, and FIG. 16 shows the entire loss head of the R section and the pressure reduction. For information, FIG. 17 shows the tube parameters with the case of right-angled bending, and FIG. 18 shows the loss head of the right-angled bending.

With the calculation as such, assuming that the curved portion has the bend radius equal to or larger than the internal diameter of the exhaust tube, it is understood that the pressure loss and the pressure reduction can be reduced twice or more than the case with the right-angled bending.

Moreover, more preferably, assuming that the curved portion has the bend radius being larger three times or more than the internal diameter of the exhaust tube, the pressure loss and the pressure reduction can be further reduced three times or more than the case with the right-angled bending.

Moreover, still more preferably, assuming that the curved portion has the bend radius being larger four times or more than the internal diameter of the exhaust tube, the pressure loss and the pressure reduction can be reduced to a further degree than the above-described case with the bend radius being larger three times or more.

Note here that, as described above, when the bend radius of not only the entire curved portion but also at least a part thereof is equal to or larger than the internal diameter of the exhaust tube, three times or more of the internal diameter thereof, or four times or more of the internal diameter thereof, any constant effects can be expected to be achieved.

Furthermore, assuming that the bending of the curved portion is R-bending (bending at about 90° from the vertical direction to the substantially horizontal direction), the bending can be performed with good efficiency while utilizing effectively the space of the reaction tube in the vertical direction.

Note here that the reason of using the temperature of 300° C. in the temperature parameters for the above calculation is that the polyimide-treated gas starts liquefaction at about 300° C.

In the above, the reason of tilting (curving) the exhaust tube is to prevent any accumulation of liquid waste and not to reduce the flow velocity of the exhaust gas as described above. That is, if the exhaust tube is reduced in width, the space between the heater to be disposed around the reaction tube and the reaction tube can be reduced, and the temperature control can be applied with more ease. On the other hand, it is also for preventing the amount of exhaustion being reduced, and preventing a difficulty in keeping any desired amount of exhaustion if the flow velocity is reduced.

Note here that, alternatively, the area from the connection portion with the exhaust tube to the exhaustion trap may be tilted, and even if the exhaust gas is liquefied, the gas may be made to flow and not to stay.

Moreover, by curving as described above the portion where the upper end portion of the reaction tube is connected with the exhaust tube, the flow velocity of the exhaust gas may not be reduced to a further degree.

Moreover, according to the embodiments, it is especially effective if with a treatment for vaporization of accumulation and remaining left on the surfaces of the wafers such as polyimide cure (polyimide bake), Cu annealing, and others. Furthermore, such a treatment is not restrictive, and the embodiments serve effective for a treatment of oxidation, diffusion, decompression CVD, and any other annealing treatment.

While the preferred embodiments of the invention have been described in detail, it will be obvious for those skilled in the art that numerous other modifications and variations can be devised without departing from the spirit and scope of the invention.

INDUSTRIAL APPLICABILITY

As described in detail in the above, according to the invention, provided is a substrate treatment device that can lengthen the maintenance cycle, and prevent any by-product from falling on substrates even if it is accumulated, and a manufacturing method of such a substrate treatment device.

Moreover, according to the invention, any possible temperature reduction of an exhaust gas after a treatment can be prevented, by-product attachment and liquefaction of the gas after the treatment can be prevented, and the serviceability ratio can be increased by preventing substrate pollution or by lengthening the maintenance cycle.

The invention claimed is:

1. A substrate treatment device, comprising:
a treatment chamber that subjects a substrate to a treatment while keeping hold of it by a substrate retention member;
a reaction tube that configures the treatment chamber;
a heating device that is disposed around the reaction tube for heating the treatment chamber;
an exhaust tube that is linked to the reaction tube on a side higher than the substrate in the treatment chamber and is extended downward from the heating device, and exhausts a gas inside of the reaction tube in which an extension portion as a result of the extension is disposed away from the reaction tube; and
a support section between the extension portion and the reaction tube for supporting the extension portion.

2. The substrate treatment device according to claim 1, wherein the extension portion is curved as to be away from the reaction tube.

3. The substrate treatment device according to claim 1, wherein the extension portion is at least partially bent with a bend radius equal to or larger than an internal diameter of the exhaust tube.

4. The substrate treatment device according to claim 1, wherein the extension portion is at least partially bent with a bend radius of three times or more of an internal diameter of the exhaust tube.

5. The substrate treatment device according to claim 1, wherein the extension portion is radius-bent at least to be of a size equal to or larger than an internal diameter of the exhaust tube.

6. The substrate treatment device according to claim 1, wherein the extension portion is radius-bent at least to be of a size three times or more of an internal diameter of the exhaust tube.

7. The substrate treatment device according to claim 1, further comprising:
a heat insulation material or an auxiliary heating device at least between the extension portion and the reaction tube.

8. The substrate treatment device according to claim 1, further comprising:
a heat insulation material or an auxiliary heating device around the extension portion not including the support section.

9. The substrate treatment device according to claim 1, further comprising:
a throttle section to a side wall located on an upstream side of the substrate of the reaction tube.

10. The substrate treatment device according to claim 9, further comprising:
a heat insulation material or an auxiliary heating device between the throttle section and the extension portion of the exhaust tube.

11. A manufacturing method of a semiconductor device, the method comprising:
moving a substrate into an inside of a reaction tube;
subjecting the substrate to a treatment inside of the reaction tube; and
moving out the treated substrate from the reaction tube,
wherein, in the subjecting the substrate to the treatment, a gas is supplied from a lower portion of the reaction tube into the inside of the reaction tube, and the gas is exhausted through an exhaust tube that is linked to the reaction tube on a side higher than the substrate inside of the treatment chamber and is extended downward from a heating device surrounding the treatment chamber, and in which an extension portion as a result of the extension is disposed away from the reaction tube, and supporting a support section between the extension portion and the reaction tube.

12. A manufacturing method of a semiconductor device according to claim 11, wherein
in the subjecting the substrate to the treatment, the extension portion is heated at a temperature substantially the same as a temperature for the heating device to heat the substrate.

13. The manufacturing method of the semiconductor device according to claim 11, wherein the subjecting the substrate to the treatment comprises subjecting a substrate a treatment that comprises coating the substrate with a polyimide material or a polybenzoxazole material.

14. A manufacturing method of a semiconductor device that subjects a substrate to a treatment using the substrate treatment device of claim 1, wherein the substrate is subjected to the treatment while a gas is being supplied from a lower portion of the reaction tube into the inside of the reaction tube, and the gas is exhausted through an exhaust tube that is linked to the reaction tube on a side higher than the substrate inside of the treatment chamber and is extended downward from the heating device, and in which an extension portion as a result of the extension is disposed away from the reaction tube.

15. A manufacturing method of a semiconductor device that subjects a substrate to a treatment using the substrate treatment device of claim 1, wherein the substrate is subjected to the treatment while a gas is being supplied from a lower portion of the reaction tube into the inside of the reaction tube, and when the gas is exhausted through an extension portion that is linked to the reaction tube on a side higher than the substrate inside of the treatment chamber and is a result of an extension downward from the heating device, the extension portion is heated at a temperature substantially the same as a temperature for the heating device to heat the substrate.

16. The manufacturing method of the semiconductor device according to claim 12, wherein the subjecting the substrate to the treatment comprises subjecting a substrate to a treatment wherein the substrate is coated with a polyimide material or a polybenzoxazole material.

17. A manufacturing method of a semiconductor device, the method comprising:

moving a substrate into an inside of a reaction tube;

subjecting the substrate to a treatment inside of the reaction tube; and moving out the treated substrate from the reaction tube, wherein, in the subjecting the substrate to the treatment, a gas is supplied from a lower portion of the reaction tube into the inside of the reaction tube, and the gas is exhausted through an exhaust tube that is linked from the substrate to the reaction tube on a side higher than the substrate inside of the treatment chamber and is extended downward from the heating device, and in which an extension portion as a result of the extension is disposed away from the reaction tube, and wherein the subjecting the substrate to the treatment comprises subjecting a substrate to a treatment that comprises coating the substrate with a polyimide material or a polybenzoxazole material.

* * * * *